(12) United States Patent
Takeda et al.

(10) Patent No.: US 11,947,723 B2
(45) Date of Patent: Apr. 2, 2024

(54) DECODING DEVICE, DECODING METHOD, AND PROGRAM

(71) Applicant: Sony Group Corporation, Tokyo (JP)

(72) Inventors: Hirofumi Takeda, Kanagawa (JP); Shuichiro Nishigori, Tokyo (JP); Takuma Domae, Kanagawa (JP); Toshiyuki Nakagawa, Kanagawa (JP); Shiro Suzuki, Kanagawa (JP); Takahiro Watanabe, Tokyo (JP)

(73) Assignee: Sony Group Corporation, Tokyo (JP)

( * ) Notice: Subject to any disclaimer, the term of this patent is extended or adjusted under 35 U.S.C. 154(b) by 228 days.

(21) Appl. No.: 17/425,705

(22) PCT Filed: Jan. 24, 2020

(86) PCT No.: PCT/JP2020/002482
§ 371 (c)(1),
(2) Date: Jul. 23, 2021

(87) PCT Pub. No.: WO2020/158596
PCT Pub. Date: Aug. 6, 2020

(65) Prior Publication Data
US 2022/0187915 A1 Jun. 16, 2022

(30) Foreign Application Priority Data
Feb. 1, 2019 (JP) .................. 2019-017136

(51) Int. Cl.
*G06F 3/01* (2006.01)
*H03M 7/30* (2006.01)

(52) U.S. Cl.
CPC .......... *G06F 3/016* (2013.01); *H03M 7/6005* (2013.01); *H03M 7/70* (2013.01)

(58) Field of Classification Search
CPC ........................................ G06F 3/016
See application file for complete search history.

(56) References Cited

U.S. PATENT DOCUMENTS

2011/0032088 A1 2/2011 Kim
2014/0347177 A1\* 11/2014 Phan .................. A63F 13/285
340/407.1
(Continued)

FOREIGN PATENT DOCUMENTS

CN 101120593 A 2/2008
CN 101895371 A 11/2010
(Continued)

OTHER PUBLICATIONS

International Written Opinion and English translation thereof dated Mar. 10, 2020 in connection with International Application No. PCT/JP2020/002482.
(Continued)

*Primary Examiner* — Travis R Hunnings
(74) *Attorney, Agent, or Firm* — Wolf, Greenfield & Sacks, P.C.

(57) ABSTRACT

Provided is a decoding device including a decoding unit configured to decode a plurality of pieces of encoded data on the basis of encoding method information that has been received, received bitstream data including the plurality of pieces of encoded data in which a plurality of segments of a tactile signal has been respectively encoded, in which the encoding method information includes information indicating in which encoding method of a plurality of encoding methods the respective segments of the tactile signal have been encoded, the plurality of encoding methods includes a simple tactile encoding method corresponding to a simple tactile signal related to a beginning segment of the tactile signal, the plurality of pieces of encoded data includes simple tactile encoded data in which the simple tactile signal has been encoded in the simple tactile encoding method, and the decoding unit decodes the simple tactile encoded data, in
(Continued)

a case where the encoding method information indicates the simple tactile encoding method.

20 Claims, 16 Drawing Sheets

(56) References Cited

U.S. PATENT DOCUMENTS

| | | | |
|---|---|---|---|
| 2015/0189223 A1 | 7/2015 | Levesque et al. | |
| 2018/0200619 A1* | 7/2018 | Guillotel | G06F 3/016 |
| 2018/0218576 A1* | 8/2018 | Bharitkar | G10L 19/167 |
| 2019/0279472 A1 | 9/2019 | Ito et al. | |
| 2023/0122545 A1* | 4/2023 | Nishigori | G06F 3/016 |
| | | | 725/9 |
| 2023/0131395 A1* | 4/2023 | Nishigori | G06F 3/016 |
| | | | 345/173 |

FOREIGN PATENT DOCUMENTS

| | | |
|---|---|---|
| CN | 104460978 A | 3/2015 |
| JP | 2006-163579 A | 6/2006 |
| JP | 2015-130169 A | 7/2015 |
| JP | 2016-202486 A | 12/2016 |
| JP | 2018-060313 A | 4/2018 |
| JP | 2018171514 A | 11/2018 |

OTHER PUBLICATIONS

International Preliminary Report on Patentability and English translation thereof dated Aug. 12, 2021 in connection with International Application No. PCT/JP2020/002482.

International Search Report and English translation thereof dated Mar. 10, 2020 in connection with International Application No. PCT/JP2020/002482.

Chinese Office Action dated Dec. 7, 2023 in connection with Chinese Application No. 202080007744.X, and English translation thereof.

Fenghua et al., Haptic Data Compression by Curve Fitting. Journal of Computer-Aided Design & Computer Graphics. Mar. 2015;27(3):508-13.

* cited by examiner

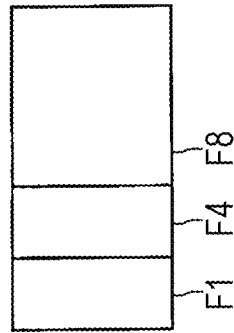
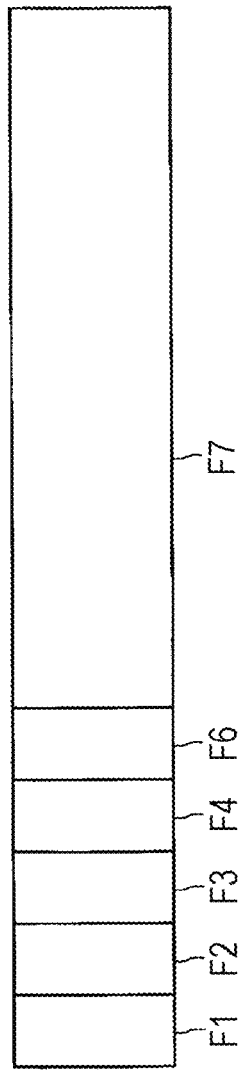
FIG. 6

DECODING DEVICE, DECODING METHOD, AND PROGRAM

Cross-Reference to Related Applications

This application claims the benefit under 35 U.S.C. § 371 as a U.S. National Stage Entry of International Application No. PCT/JP2020/002482, filed in the Japanese Patent Office as a Receiving Office on Jan. 24, 2020, which claims priority to Japanese Patent Application Number JP 2019-017136, filed in the Japanese Patent Office on Feb. 1, 2019, each of which is hereby incorporated by reference in its entirety.

TECHNICAL FIELD

The present disclosure relates to a decoding device, a decoding method, and a program.

BACKGROUND ART

In these years, a technique is developed for giving a tactile stimulus to a user on the basis of a tactile signal that has been received from an external device. For example, Patent Document 1 discloses a technique for giving a tactile stimulus to a user while changing the frequency and amplitude of vibrations on the basis of a received signal.

CITATION LIST

Patent Document

Patent Document 1: Japanese Patent Application Laid-Open No. 2016-202486

SUMMARY OF THE INVENTION

Problems to Be Solved by the Invention

As the reality feeling of the tactile sensation to be presented is enhanced, by the way, the necessary data amount of the tactile signal generally increases, or the network situation changes. Hence, the possibility that a transmission delay of the tactile signal occurs becomes higher. However, in the technique described in Patent Document 1, no consideration is given to achieving both an increase in the data amount of the tactile signal and a low delay in transmission.

Solutions to Problems

According to the present disclosure, provided is a decoding device including a decoding unit configured to decode a plurality of pieces of encoded data on the basis of encoding method information that has been received, received bitstream data including the plurality of pieces of encoded data in which a plurality of segments of a tactile signal has been respectively encoded, in which the encoding method information includes information indicating in which encoding method of a plurality of encoding methods the respective segments of the tactile signal have been encoded, the plurality of encoding methods includes a simple tactile encoding method corresponding to a simple tactile signal related to a beginning segment of the tactile signal, the plurality of pieces of encoded data includes simple tactile encoded data in which the simple tactile signal has been encoded in the simple tactile encoding method, and the decoding unit decodes the simple tactile encoded data, in a case where the encoding method information indicates the simple tactile encoding method.

Further, according to the present disclosure, provided is a decoding method including decoding, by a processor, a plurality of pieces of encoded data on the basis of encoding method information that has been received, received bitstream data including the plurality of pieces of encoded data in which a plurality of segments of a tactile signal has been respectively encoded, in which the encoding method information includes information indicating in which encoding method of a plurality of encoding methods the respective segments of the tactile signal have been encoded, the plurality of encoding methods includes a simple tactile encoding method corresponding to a simple tactile signal related to a beginning segment of the tactile signal, and the plurality of pieces of encoded data includes simple tactile encoded data in which the simple tactile signal has been encoded in the simple tactile encoding method, the decoding method further including decoding the simple tactile encoded data, in a case where the encoding method information indicates the simple tactile encoding method.

Further, according to the present disclosure, provided is a program causing a computer to function as a decoding device, the decoding device including a decoding unit configured to decode a plurality of pieces of encoded data on the basis of encoding method information that has been received, received bitstream data including the plurality of pieces of encoded data in which a plurality of segments of a tactile signal has been respectively encoded, in which the encoding method information includes information indicating in which encoding method of a plurality of encoding methods the respective segments of the tactile signal have been encoded, the plurality of encoding methods includes a simple tactile encoding method corresponding to a simple tactile signal related to a beginning segment of the tactile signal, the plurality of pieces of encoded data includes simple tactile encoded data in which the simple tactile signal has been encoded in the simple tactile encoding method, and the decoding unit decodes the simple tactile encoded data, in a case where the encoding method information indicates the simple tactile encoding method.

BRIEF DESCRIPTION OF DRAWINGS

FIG. 6 is a diagram for describing an example of the frame format FF related to the generation of the transmission and reception data TD by the encoding unit 34 according to the embodiment.

MODE FOR CARRYING OUT THE INVENTION

Figure 1:
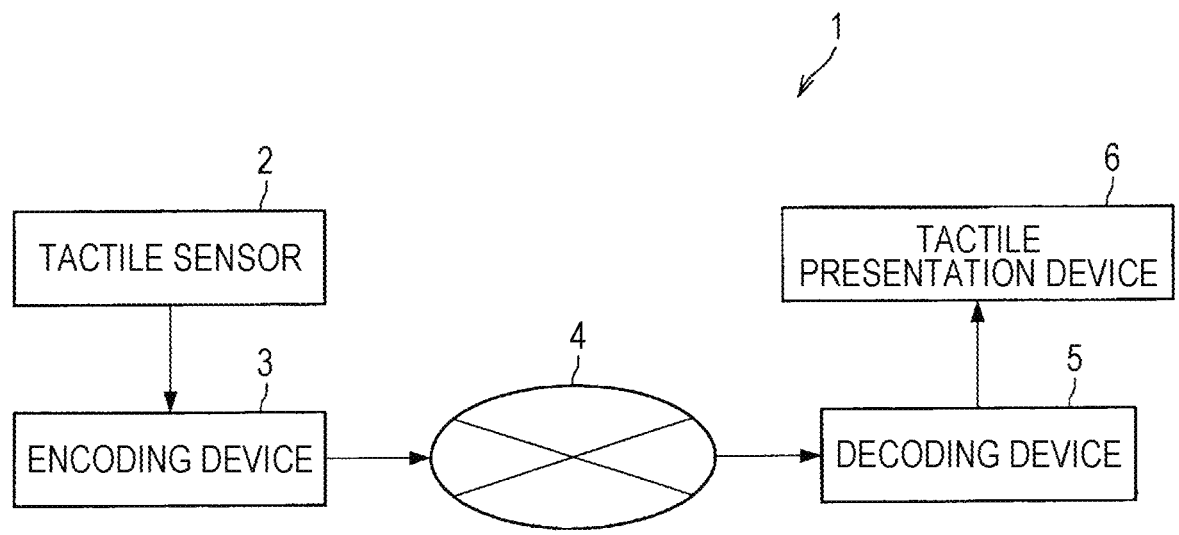
FIG. 1 is a diagram for describing an example of a tactile presentation system 1 according to the present embodiment.

Hereinafter, preferred embodiments of the present disclosure will be described in detail with reference to the accompanying drawings. It is to be noted that in the present specification and the drawings, components having substantially the same functional configuration are designated by the same reference numerals to omit duplicate description.

It is to be noted that the description will be given in the following order.
1. Background
2. Embodiment
2.1. Overview
2.2. Functional configuration example
  2.2.1. Configuration example of tactile presentation system 1
  2.2.2. Functional configuration example of encoding device 3
  2.2.3. Example of encoding process by encoding unit 34
  2.2.4. Functional configuration example of decoding device 5
2.3. Specific example
2.4. Operation example
2.5. Modification example
3. Hardware configuration example
4. Conclusion
<1. Background>
First, the background of the present disclosure will be described. In these years, a technique, in which a device worn by a user vibrates to give a tactile stimulus to the user, is developed. Here, the tactile stimulus refers to a physical phenomenon that makes the user feel a tactile sensation using a vibration phenomenon or the like. Further, hereinafter, generating the tactile stimulus will be referred to as a tactile presentation.

Techniques dealing with the tactile presentations are utilized in devices in various fields. For example, on a terminal device equipped with a touch panel, such as a smartphone or the like, the touch panel vibrates in response to a touch operation of a user, and gives a tactile stimulus to a user's finger, so as to enable representation of a touch feeling onto a button or the like displayed on the touch panel. Further, for example, on a music listening device such as a headphone or the like, a tactile stimulus is given in accordance with playing of music, so as to enable emphasis on the deep bass in the music being played. Further, for example, on a device for providing a computer game or vertual reality (VR), the controller or the like is made to vibrate in accordance with an operation using the controller or a content scene to give a tactile stimulus, so as to enable an improvement in the user's immersion feeling on a content.

<2. Embodiment>
<2.1. Overview>

In order to present a tactile sensation with a more reality feeling, by the way, vibration of the tactile sensation to be presented is actually recorded by a tactile sensor, in some cases. However, usually, the data amount of the tactile signal of the vibration that has been actually recorded is larger than that of the tactile signal of the vibration that has been generated on the tactile presentation device side. For such a reason, in a case where the tactile sensation, the actual vibration of which has been recorded, is presented to a user, for example, a wired connection of a faster transmission speed has a higher possibility that transmission and reception of the tactile signal is conducted, and the transmission delay of the tactile signal is prevented than a wireless connection between a recording side device and a presenting side device.

However, for example, on a scene in which a large number of users are moving around in watching sports or watching live performances, there is a high possibility that the presence of a cable in a wired connection with a tactile presentation device makes the users feel annoyed. Therefore, from the viewpoint of user comfortability, the wireless connection between the tactile presentation device worn by each user and a vibration recording device can be selected instead of the wired connection. However, as described above, in a case where the tactile signal in which actual vibration has been recorded is transmitted and received, the data amount becomes large. Hence, the transmission and reception of the tactile signal wirelessly may cause a transmission delay.

In addition, in a case where a tactile signal is transmitted wirelessly, a tactile stimulus is not given to the user at an appropriate timing due to the transmission delay. Hence, this causes a situation in which the real-time property of the tactile presentation is lost such that visual and auditory senses are not in synchronization with the tactile sensation, and there is a possibility that the user feels a sense of incongruity with respect to the tactile sensation that has been presented.

In particular, since the tactile sensation is strongly associated with a deep sensation, the delay in giving the tactile sensation has a large effect on the deep sensation. It is to be noted that the deep sensation denotes a sensation caused by a receptor present in a deep part of the body, for example, a position sensation, a kinesthetic sensation, or a weight sensation. That is to say, the delay in giving the tactile presentation influences the sensation of how much force is applied to one's own body and the sensation of how much one's own body has been actively moved. Hence, there is a possibility that the user feels a sense of incongruity. In particular, in a segment where the tactile sensation starts to be felt firstly, there is a possibility that the delay in the tactile presentation gives the user a greater sense of incongruity.

The present disclosure has been made in view of the above circumstances, and has an object of achieving both the quality maintenance of a tactile sensation to be presented to a user and a low delay in transmission of a tactile signal, so as to enable realization of a tactile experience having both the real-time property and the reality feeling of the user.

<2.2. Functional Configuration Example>

<2.2.1. Configuration Example of Tactile Presentation System 1>

Subsequently, an outline of a tactile presentation system 1 will be described with reference to FIG. 1. FIG. 1 is a diagram for describing an example of the tactile presentation system 1 according to the present embodiment. The tactile presentation system 1 includes a tactile sensor 2, an encoding device 3, a decoding device 5, and a tactile presentation device 6.

The tactile sensor 2 is a sensor that senses a tactile stimulus and acquires a tactile signal TS as a voltage change. The tactile sensor 2 is installed in a recording target of the tactile stimulus. For example, in a case where a movement or the like of a user U is a recording target, the tactile sensor 2 is installed in contact with an object held by the user U or a predetermined part of the body of the user U. It is to be noted that the tactile sensor 2 includes a vibration sensor, for example, a piezo pickup, an acceleration sensor, or the like.

The encoding device 3 generates transmission and reception data TD on the basis of the tactile signal TS that has been acquired by the tactile sensor 2. Specifically, the encoding device 3 performs a conversion process and an encoding process according to a predetermined data format on the tactile signal TS that has been acquired by the tactile sensor 2, and generates transmission and reception data TD. It is to be noted that the encoding device 3 includes a central processing unit (CPU), a digital signal processor (DSP), or the like.

A network 4 is a wired or wireless transmission line of information between the encoding device 3 and the decoding device 5. For example, the network 4 may include a public network such as the Internet, a telephone line network, a satellite communication network, various types of local area network (LAN) including Ethernet (registered trademark), and a wide area network (WAN). Further, the network 4 may include a dedicated line network such as Internet protocol-virtual private network (IP-VPN). It is to be noted that direct communication may be conducted between the encoding device 3 and the decoding device 5 without passing through the network 4. For example, the transmission and reception data TD that has been transmitted by the encoding device 3 may be temporarily stored in a cloud storage server provided in the network 4.

The decoding device 5 generates a tactile signal TS on the basis of the transmission and reception data TD that has been received from the encoding device 3. Specifically, the decoding device 5 performs a decoding process and various processes on the transmission and reception data TD that has been received from the encoding device 3, and generates the tactile signal TS.

The tactile presentation device 6 is a device that generates a tactile stimulus to present a tactile sensation to a user. It is to be noted that the tactile presentation device 6 includes a vibration device, for example, a vibrator, an actuator, or the like. For example, in a case where the tactile presentation device 6 gives a tactile stimulus to the user with the tactile signal TS, the vibration and movement that have been acquired by the tactile sensor 2 are reproduced.

Heretofore, the overview of the configuration of the tactile presentation system 1 has been described. In this manner, the tactile presentation system 1 is capable of transmitting the tactile sensation that has been recorded by the tactile sensor 2 to the tactile presentation device 6, so that the tactile presentation device 6 is capable of giving the tactile stimulus to the user.

<2.2.2. Functional Configuration Example of Encoding Device 3>

Figure 2:
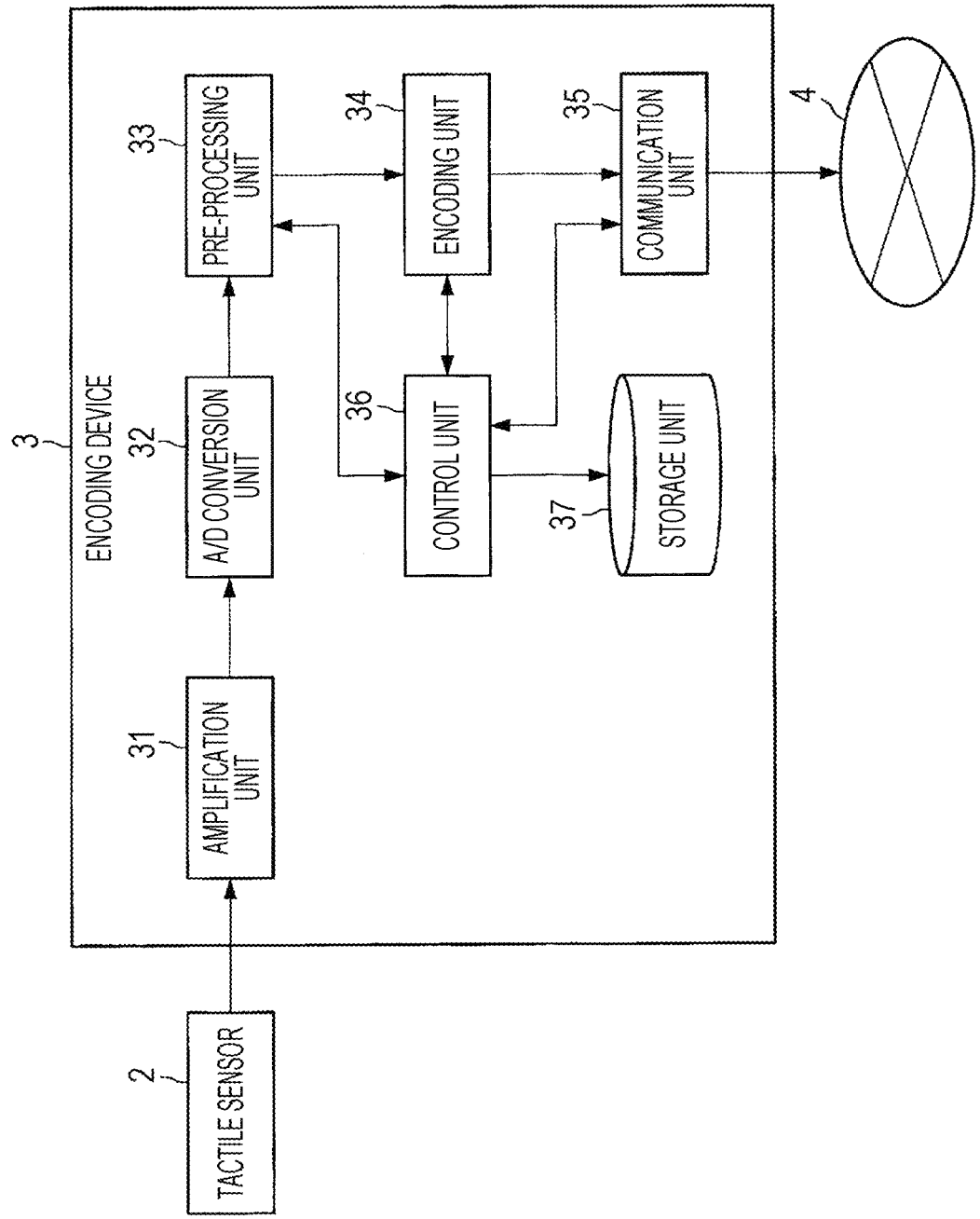
FIG. 2 is a diagram for describing an example of a functional configuration of an encoding device 3 according to the embodiment.

Subsequently, an example of a functional configuration of the encoding device 3 according to the present embodiment will be described. FIG. 2 is a diagram for describing an example of a functional configuration of the encoding device 3 according to the present embodiment. As shown in FIG. 2, the encoding device 3 includes an amplification unit 31, an A/D conversion unit 32, a pre-processing unit 33, an encoding unit 34, a communication unit 35, a control unit 36, and a storage unit 37.

The amplification unit 31 performs a process of adjusting the tactile signal TS that has been transmitted from the tactile sensor 2 to be an appropriate dynamic range using an amplifier 310. In a case where a plurality of tactile signals TS is present, the amplification unit 31 performs a dynamic range adjustment process using the amplifier.

The A/D conversion unit 32 converts an analog signal that has been transmitted from the amplification unit 31 into a digital signal using an A/D converter 320.

The pre-processing unit 33 performs various digital signal processes, such as noise removal, calibration of sensor characteristics of the tactile sensor 2, or the like, on the digital signal that has been converted by the A/D conversion unit 32.

The encoding unit 34 performs various processes and an encoding process on the tactile signal TS that has been processed by the pre-processing unit 33 according to a predetermined data format, and generates transmission and reception data TD.

The encoding unit 34 encodes the tactile signal TS in any of a plurality of encoding methods. Specifically, the encoding unit 34 generates a simple tactile signal SS indicating a beginning segment of the tactile signal TS, encodes the simple tactile signal SS that has been generated, and generates simple tactile encoded data SDC. Further, the encoding unit 34 generates (extracts) a rich tactile signal RS indicating a segment other than the beginning of the tactile signal TS, encodes the rich tactile signal RS, and generates rich tactile encoded data RDC. The details of an encoding method of the encoding unit 34 will be described later.

The communication unit 35 communicates with an external device via a network such as the Internet or the like. For example, the communication unit 35 transmits the transmission and reception data TD that has been generated by the encoding unit 34 to the reproducing device 4.

The control unit 36 controls each function of the encoding device 3. It is to be noted that the control unit 36 includes, for example, a CPU, a random access memory (RAM), a read only memory (ROM), and the like.

The storage unit 37 stores information regarding the various processes performed by the encoding device 3. The storage unit 37 may store, for example, the transmission and reception data TD that has been generated by the encoding unit 34. It is to be noted that the storage unit 37 includes, for example, a hard disk drive (HDD), a solid state drive (SSD), or the like.

<2.2.3. Example of Encoding Process by Encoding Unit 34>

Figure 3:
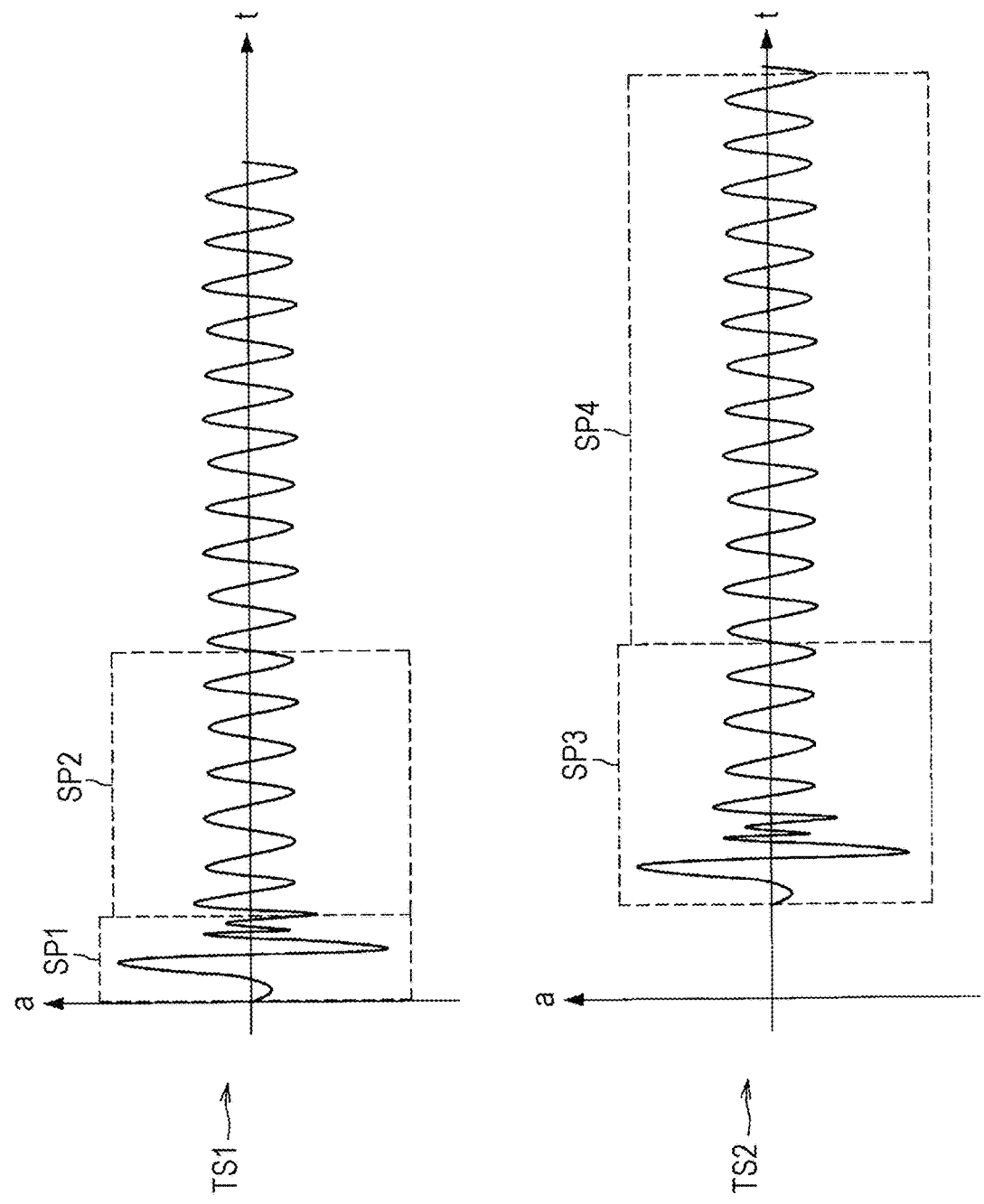
FIG. 3 is a diagram for describing an encoding process by an encoding unit 34 of the encoding device 3 according to the embodiment.

Subsequently, the encoding process by the encoding unit 34 in the encoding device 3 will be described with reference to FIG. 3. FIG. 3 is a diagram for describing the encoding process by the encoding unit 34 in the encoding device 3 according to the present embodiment.

After the encoding device 3 starts receiving the tactile signal TS from the tactile sensor 2, the encoding unit 34 detects a beginning segment of the tactile signal TS that has been received from the pre-processing unit 33, and generates the simple tactile signal SS indicating the beginning segment of the tactile signal TS that has been detected. Here, the beginning segment of the tactile signal TS means the tactile signal TS in a segment from the time when the tactile signal TS starts to be generated to a predetermined time in time-series data of the tactile signal TS It is to be noted that the beginning segment of the tactile signal TS may be a signal at the time corresponding to a waveform segment indicating a rise firstly in the tactile signal TS.

Further, the simple tactile signal SS may be a segment of the tactile signal TS in a longer period of time than a rise of a first amplitude of the tactile signal TS. For example, the encoding unit 34 may detect generation of the tactile signal TS on the basis of the rise of the first amplitude of the tactile signal TS, and may generate a simple tactile signal SS with a segment of the tactile signal TS in a longer period of time than the rising segment of the tactile signal TS being as a beginning segment, on the base of the detection of the generation of the tactile signal TS.

In addition, the simple tactile signal SS may be a signal indicating the beginning segment of the tactile signal TS, that is, a signal including information capable of generating, by the decoding device 5, a signal corresponding to the beginning segment of the tactile signal TS. Further, for example, the simple tactile signal SS may be, for example, a trigger signal indicating that the beginning segment of the tactile signal TS is generated. The trigger signal is a signal having a predetermined waveform in which the information regarding the trigger signal is shared beforehand between the encoding device 3 and the decoding device 5. The encoding unit 34 may generate a trigger signal as the simple tactile signal SS on the basis of the beginning segment of the tactile signal TS. It is to be noted that in a case of having acquired the trigger signal from the data that has been received from the encoding device 3, the decoding device 5 generates the beginning segment of the tactile signal TS, and transmits the beginning segment that has been generated to the tactile presentation device 6.

The simple tactile signal SS may be, for example, identification information corresponding to the beginning segment of the tactile signal TS. For example, in a case where there is a plurality of types of beginning segment of the tactile signal TS that can be acquired, the encoding unit 34 may generate identification information as the corresponding simple tactile signal SS on the basis of the beginning segment of the tactile signal TS. It is to be noted that in a case of acquiring the trigger signal from the data that has been received from the encoding device 3, the decoding device 5 generates a beginning segment of the tactile signal TS corresponding to the identification information, and transmits the beginning segment that has been generated to the tactile presentation device 6.

The simple tactile signal SS is, for example, a parameter capable of parametrically presenting the beginning segment of the tactile signal TS. The encoding unit 34 may extract a parameter as the simple tactile signal SS from the beginning segment of the tactile signal TS. Here, the parameter of the beginning segment of the tactile signal TS includes a feature amount with which the beginning segment of the tactile signal TS can be generated. It is to be noted that in a case of acquiring the parameter of the beginning segment of the tactile signal TS from the data that has been received from the encoding device 3, the decoding device 5 generates the beginning segment of the tactile signal TS on the basis of the parameter. The beginning segment of the tactile signal TS to be generated is generated from the parameter, and therefore, is not the same with the beginning segment of the tactile signal TS that has been recorded by the tactile sensor 2, but may be a similar signal.

Figure 4:
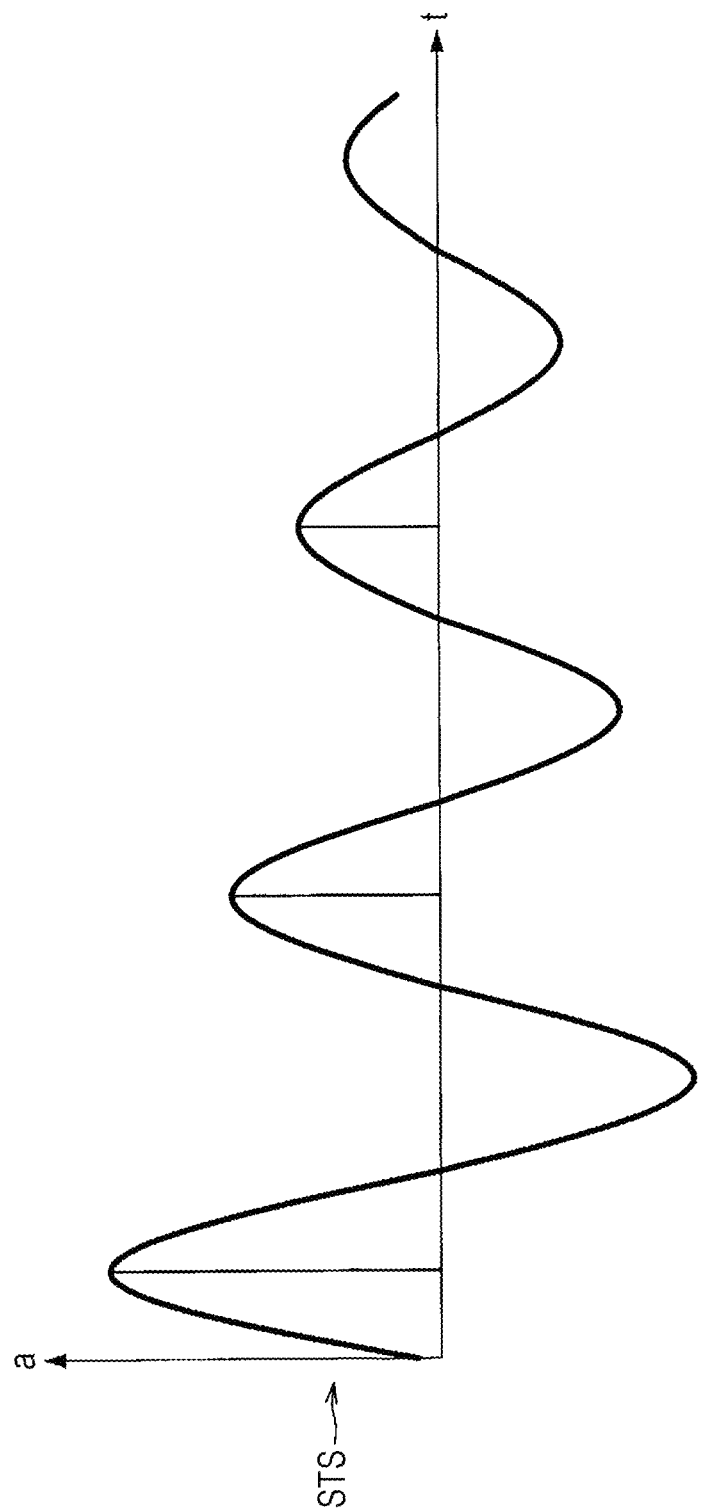
FIG. 4 is a diagram for describing a beginning segment of a tactile signal TS to be presented in a case where a parameter of the beginning segment of the tactile signal TS according to the embodiment is a parameter of an attenuated sinusoidal signal.

It is to be noted that the parameter of the beginning segment of the tactile signal TS may be a parameter of the attenuated sinusoidal signal. The attenuated sinusoidal signal is suitable as a preset signal, because the attenuated sinusoidal signal exhibits vibrations similar to various physical vibrations and movements. FIG. 4 is a diagram for describing the beginning segment of the tactile signal TS to be presented, in a case where the parameter of the beginning segment of the tactile signal TS according to the present embodiment is a parameter of the attenuated sinusoidal signal. FIG. 4 shows an attenuated sinusoidal signal that can be generated by the parameter of the beginning segment of the tactile signal TS.

By presenting to the user U, the beginning segment of the tactile signal TS that is gradually attenuated as shown in FIG. 4, it is possible to achieve both various physical vibrations and movements such as a collision with an object being presented to the user U as a tactile sensation at a level that does not cause a sense of incongruity to the user U, and a more efficient reduction in the amount of data to be transmitted and received between the encoding device 3 and the decoding device 5.

Regarding the parameter of the attenuated sinusoidal signal as the parameter of the beginning segment of the tactile signal TS, for example, parameters A, λ, and ω may be calculated so that a difference of the attenuated sinusoidal wave represented in Expression (1) with respect to a signal f[n] to be transmitted becomes smaller than a predetermined value, and may be extracted as the simple tactile signal SS.

[Expression 1]

$$B(x) = Ae^{\lambda n} \sin \omega n \qquad (1)$$

ω of the above parameters is calculated as, for example, an inverse of a time difference m, which is the peak in an autocorrelation function of the signal f[n] represented in Expression (2).

[Expression 2]

$$R[m] = \Sigma_{n=0}^{N-1} f[n] f[n-m] \qquad (2)$$

A and λ of the parameters of the attenuated sinusoidal wave are obtained by calculating A and λ that minimize the sum of the signal f[n] and a square error of the logarithm of the attenuated sinusoidal wave represented in Expression (1). For example, A and λ as parameters of the attenuated sinusoidal wave are calculated by calculating A and λ to by minimize the square error e represented by Expression (3).

[Expression 3]

$$e(A,\lambda) = \Sigma_{n=0}^{N-1} (\log f[n] - \log Ae^{\lambda n} \sin \omega n)^2 \qquad (3)$$

It is to be noted that the encoding unit 34 encodes the simple tactile signal SS that has been generated to generate simple tactile encoded data SDC. The simple tactile encoded data SDC is transmitted to the decoding device 5, and is decoded.

On the other hand, the encoding unit 34 acquires a segment other than the beginning of the tactile signal TS that has been received from the pre-processing unit 33, and generates a rich tactile signal RS indicating the segment other than the beginning of the tactile signal TS that has been acquired. The segment other than the beginning of the tactile signal TS means, for example, a signal in a segment from the time when the tactile signal TS starts to be generated to a predetermined time and later in the time-series data of the tactile signal TS. That is, the rich tactile signal RS is, for example, a signal indicating other than the segment indicated by the simple tactile signal SS in the tactile signal TS. It is to be noted that the rich tactile signal RS may refer to the respective signals of a plurality of segments into which the segment other than the beginning of the tactile signal TS is divided.

In a case where a plurality of rich tactile signals RS is present, the encoding unit 34 encodes the respective rich tactile signals RS. The rich tactile signal RS may be a signal that has been extracted from the segment other than the beginning of the tactile signal TS. The encoding unit 34 encodes the rich tactile signal RS that has been generated, and generates rich tactile encoded data RDC. For example, the encoding unit 34 may encode the rich tactile signal RS by waveform encoding. The waveform encoding method includes a pulse code modulation (PCM) method or the like. The rich tactile encoded data RDC is also transmitted to the decoding device, and is decoded.

Here, an example shown in FIG. 3 will be described. FIG. 3 shows an example of a tactile signal TS1 of a recording target and an example of a tactile signal TS2 to be presented to the user. The encoding unit 34 detects a rising segment SP1 of the tactile signal TS, and generates a simple tactile signal SS. The segment of the tactile signal TS indicated by the simple tactile signal SS is a segment that is longer in time than the rising segment SP1, and a signal generated from the simple tactile signal SS by the decoding device 5 is a beginning segment SP3 of the tactile signal TS2.

Next, the encoding unit 34 detects a segment SP2 other than the beginning of the tactile signal TS1, and generates a rich tactile signal RS. It is to be noted that since the beginning segment SP3 of the tactile signal TS2 that has been generated by the simple tactile signal SS is a segment that is longer in time than the rising segment of the amplitude. Therefore, the signal generated from the rich tactile signal RS by the decoding device 5 is a segment SP4 after the tactile presentation by the beginning segment SP3 of the tactile signal TS2 ends.

As described above, the encoding unit 34 performs the encoding process on the simple tactile signal SS and the rich tactile signal RS according to a predetermined data format, according to the respectively corresponding encoding methods, and generates the transmission and reception data TD. The transmission and reception data TD is data including the simple tactile encoded data SDC or data including the rich tactile encoded data RDC.

Figure 5:
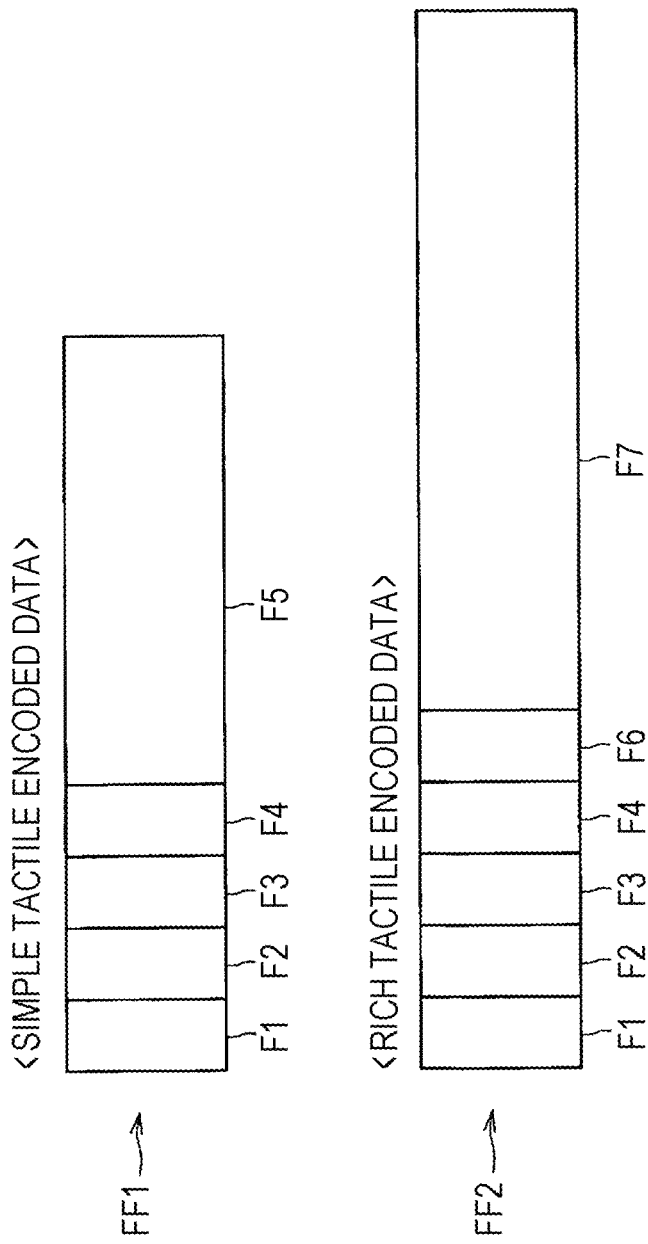
FIG. 5 is a diagram for describing an example of a frame format FF related to generation of transmission and reception data TD by the encoding unit 34 according to the embodiment.

Here, an example of the frame format FF related to the generation of the transmission and reception data TD by the encoding unit 34 will be described with reference to FIGS. 5 and 6. FIGS. 5 and 6 are diagrams for describing an example of the frame format FF related to the generation of the transmission and reception data TD by the encoding unit 34 according to the present embodiment. FIG. 5 shows a frame format FF1 of the simple tactile encoded data SDC and a frame format FF2 of the rich tactile encoded data RDC, in a case where the simple tactile signal SS is a parameter of the beginning segment of the tactile signal TS. Format F1 to F7 of the frame formats FF1 and FF2 are as follows.

F1 [16 bit]: Sync word (0xFFFE)
F2 [16 bit]: Sampling frequency
F3 [8 bit]: Quantization accuracy
F4 [1 bit]: Encoding method ID
F5 [----]: Parameter data (simple tactile encoded data SDC)
F6 [8 bit]: Number of tactile signal samples
F7 [----]: Rich tactile encoded data RDC FIG. 6 shows a frame format FF3 of the simple tactile encoded data SDC and a frame format FF4 of the rich tactile encoded data RDC, in a case where the simple tactile signal SS is the identification information of the beginning segment of the tactile signal TS. Formats F1 to F4 and F5 to F8 of the frame formats FF1 and FF2 are as follows.

F1 [16 bit]: Sync word (0xFFFE)
F2 [16 bit]: Sampling frequency
F3 [8 bit]: Quantization accuracy
F4 [1 bit]: Encoding method ID
F6 [8 bit]: Number of tactile signal samples
F7 [----]: Rich tactile encoded data RDC
F8 [----]: Identification information data (simple tactile encoded data SDC)

<2.2.4. Functional Configuration Example of Decoding Device 5>

Figure 7:
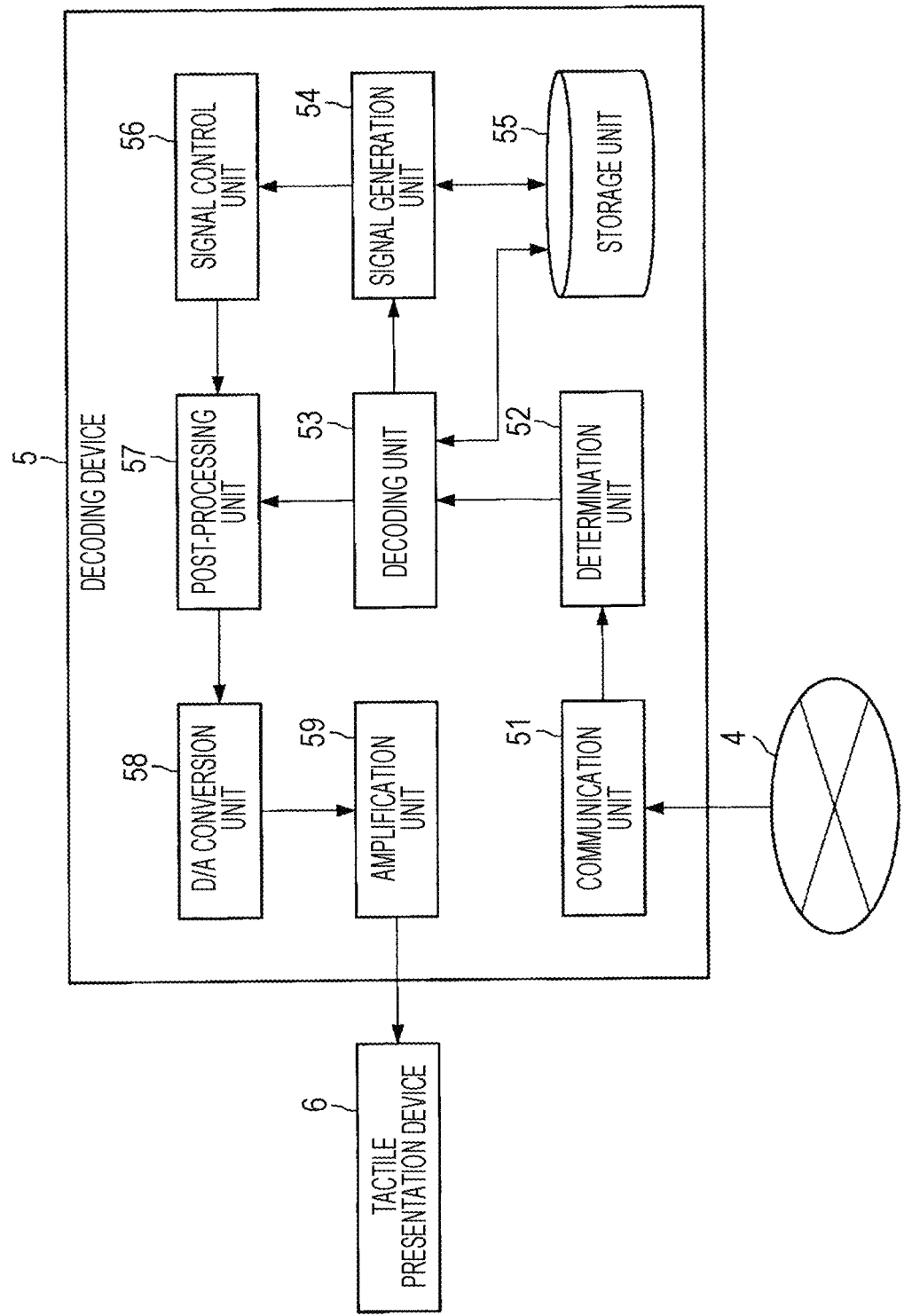
FIG. 7 is a diagram for describing an example of a functional configuration of a decoding device 5 according to the embodiment.

Subsequently, an example of the functional configuration of the decoding device 5 according to the present embodiment will be described with reference to FIG. 7. FIG. 7 is a diagram for describing an example of a functional configuration of the decoding device 5 according to the present embodiment. The decoding device 5 includes a communication unit 51, a determination unit 52, a decoding unit 53, a signal generation unit 54, a storage unit 55, a signal control unit 56, a post-processing unit 57, a D/A conversion unit 58, and an amplification unit 59.

The communication unit 51 communicates with an external device via a network such as the Internet. The communication unit 51 receives, for example, the transmission and reception data TD from the encoding device 3. For example, the communication unit 51 may receive the transmission and reception data TD by using various wireless communication methods.

The determination unit 52 determines the encoding method of each of the encoded data on the basis of the encoding method information that has been received. Specifically, the determination unit 52 acquires information indicating the encoding method from the transmission and reception data TD that has been received, and determines the encoding method for the encoded data included in the transmission and reception data TD. The information indicating the encoding method is, for example, an encoding method ID as described above. Further, the determination by the determination unit 52 clarifies which the simple tactile encoded data SDC or the rich tactile encoded data RDC is included in the transmission and reception data TD that has been received.

The decoding unit 53 decodes bitstream data that has been received and that includes at least one encoded data in which at least one segment of the tactile signal TS has been respectively encoded, on the basis of the encoding method information that has been received. The above encoded data is either the simple tactile encoded data SDC or the rich tactile encoded data RDC. In addition, information indicating which one of the plurality of encoding methods is used, and the plurality of encoding methods includes a simple tactile encoding method corresponding to the simple tactile signal related to the beginning segment of the tactile signal.

Specifically, the decoding unit 53 decodes the simple tactile encoded data SDC, in a case where the encoding method information indicates the simple tactile encoding method, and decodes the rich tactile encoded data RDC, in a case where the encoding method information indicates the rich tactile encoding method. Here, the encoding method information is, for example, an encoding method ID.

The decoding unit 53 may identify a segment of the simple tactile encoded data SDC or the rich tactile encoded data RDC in the transmission and reception data TD, for example, according to the frame format FF shown in FIG. 4 or FIG. 5, and may generate the simple tactile signal SS or the rich tactile signal RS.

The signal generation unit 54 generates a tactile signal TS in a segment corresponding to a decoding result on the basis of the decoding result by the decoding unit 53 with respect to the encoded data. Specifically, in a case where the decoding unit 53 decodes the simple tactile encoded data SDC and the simple tactile signal SS is generated, the signal generation unit 54 generates the beginning segment of the tactile signal TS to be presented, on the basis of the simple tactile signal SS. As described above, the simple tactile signal SS is identification information, a parameter, a trigger signal, or the like of the beginning segment of the tactile signal TS.

In a case where the decoding result by the decoding unit 53 indicates the trigger signal, the signal generation unit 54 generates the beginning segment of the tactile signal TS corresponding to the trigger signal. Here, the trigger signal indicating an instruction to present the beginning segment of the tactile signal TS is shared beforehand between the encoding device 3 and the decoding device 5.

Further, in a case where the decoding result by the decoding unit 53 indicates the parameter of the beginning segment of the tactile signal TS, the signal generation unit 54 generates the beginning segment of the tactile signal TS on the basis of the parameter of the beginning segment of the tactile signal TS. For example, in a case where the parameter of the tactile signal TS is a feature amount of the beginning segment of the tactile signal TS, the signal generation unit 54 generates the beginning segment of the tactile signal corresponding to the feature amount on the basis of the feature amount of the beginning segment of the tactile signal TS.

Further, in a case where the parameter of the beginning segment of the tactile signal TS is a parameter of the attenuated sinusoidal signal, the signal generation unit 54 generates the attenuated sinusoidal signal corresponding to the parameter on the basis of the parameter of the attenuated sinusoidal signal. Further, in a case where the decoding result by the decoding unit 53 indicates the identification information, the signal generation unit 54 generates the beginning segment of the tactile signal corresponding to the identification information of the beginning segment of the tactile signal TS.

The storage unit 55 stores information regarding the control of the decoding device 5. It is to be noted that the storage unit 55 includes, for example, an HDD, an SSD, or the like. Further, the storage unit 55 may include a portable removable recording medium. The storage unit 55 also functions as a reader and writer unit capable of writing into and reading from the recording medium, and is capable of reading the transmission and reception data TD to be recorded in the recording medium. It is to be noted that examples of the recording medium include a memory card such as a portable flash memory, an optical disk recording medium, and the like. It is to be noted that the storage unit 55 stores information regarding the decoding process by the decoding unit 53, information regarding the generation of the beginning segment of the tactile signal TS by the signal generation unit 54, and the like.

The signal control unit 56 switches the segment of the tactile signal TS to be presented to a user. Specifically, in a case where the beginning segment of the tactile signal TS that has been generated from the simple tactile signal SS is presented, when the segment other than the beginning of the tactile signal TS is generated from the rich tactile signal RS by the decoding unit 53, the signal control unit 56 performs a process of switching the signal to be transmitted to the tactile presentation device 6 from the beginning segment of the tactile signal TS to the segment other than the beginning.

It is to be noted that the signal control unit 56 may switch the segment of the tactile signal TS to be presented to the user by a cross-fade process. When the segment of the tactile signal TS to be presented to the user is switched by the cross-fade process, the possibility of impairing the user's tactile experience is reduced by not generating a discontinuity in the amplitude change of the tactile signal TS to be presented.

Figure 8:
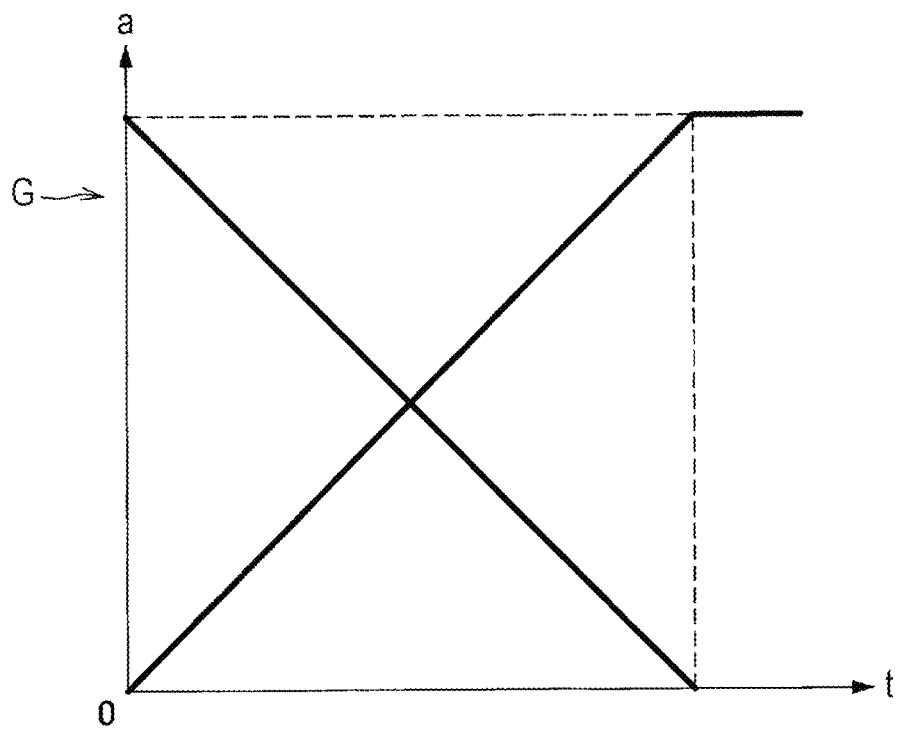
FIG. 8 is a diagram for describing an example of switching, by a cross-fade process, a segment of the tactile signal TS to be presented to a user by a signal control unit 56 according to the embodiment.

Here, with reference to FIG. 8, a description will be given with regard to an example of switching, by the cross-fade process, the segment of the tactile signal TS to be presented to the user by the signal control unit 56. FIG. 8 is a diagram for describing an example of switching, by the cross-fade process, the segment of the tactile signal TS to be presented to the user by the signal control unit 56 according to the present embodiment. FIG. 8 shows a graph G representing signal intensity of the beginning segment of the tactile signal TS to be presented and signal intensity of the segments other than the beginning.

An example of FIG. 8 will be described. Assuming that the total intensity of the tactile signal TS to be presented is a predetermined value, only the beginning segment of the tactile signal TS is presented in a situation in which no segment other than the beginning of the tactile signal TS is presented. Only the beginning segment of the tactile signal TS being presented means that only the segment of the tactile signal TS generated on the basis of the simple tactile signal SS is presented, and no segment of the tactile signal TS generated on the basis of the rich tactile signal RS is presented.

Here, once the presentation of the segment other than the beginning of the tactile signal TS starts, the intensity of the beginning segment of the tactile signal TS decreases on the basis of the intensity of the segment other than the beginning of the tactile signal TS, so that the intensity of the signal to be presented is maintained at a predetermined value. That is, the amplitude of the segment other than the beginning of the tactile signal TS gradually increases, whereas the amplitude of the beginning segment of the tactile signal TS gradually decreases. The above-described change in the amplitude of the signal may be a linear change as shown in FIG. 8, or may be a non-linear change.

Returning to FIG. 7 again, the example of the functional configuration of the decoding device 5 will be described.

The post-processing unit 57 performs signal processes such as a calibration process and a predetermined filter process related to the tactile presentation device 6.

The D/A conversion unit 58 converts a digital signal that has been transmitted from the post-processing unit 57 into an analog signal, using a D/A converter.

The amplification unit 59 performs a process of adjusting the tactile signal TS that has been transmitted from the D/A conversion unit 58 to be an appropriate dynamic range, using an amplifier, and transmits the tactile signal TS that has been adjusted to the tactile presentation device 6.

<<2.3. Specific Example>>

Subsequently, with reference to FIGS. 9 to 12, a description will be given with regard to specific scenes of transmission and presentation of the tactile signal TS by the tactile presentation system 1 according to the present embodiment. The tactile presentation system 1 according to the present embodiment is applicable to various fields. The fields to be applied include, for example, sport watching, an operation of a remote device, and a movement in a virtual space. Hereinafter, the descriptions will be given individually.

First, the scenes on which a user U has a tactile experience include sport watching. For example, the user U who is watching a baseball game can enjoy watching the baseball game more by feeling a vibration generated when a baseball player hits a ball with a bat. By reducing a time lag between the timing when the bat hits the ball and the timing when the tactile sensation is presented to the user U, the user U can feel the tactile sensation with a higher reality feeling.

Figure 9:
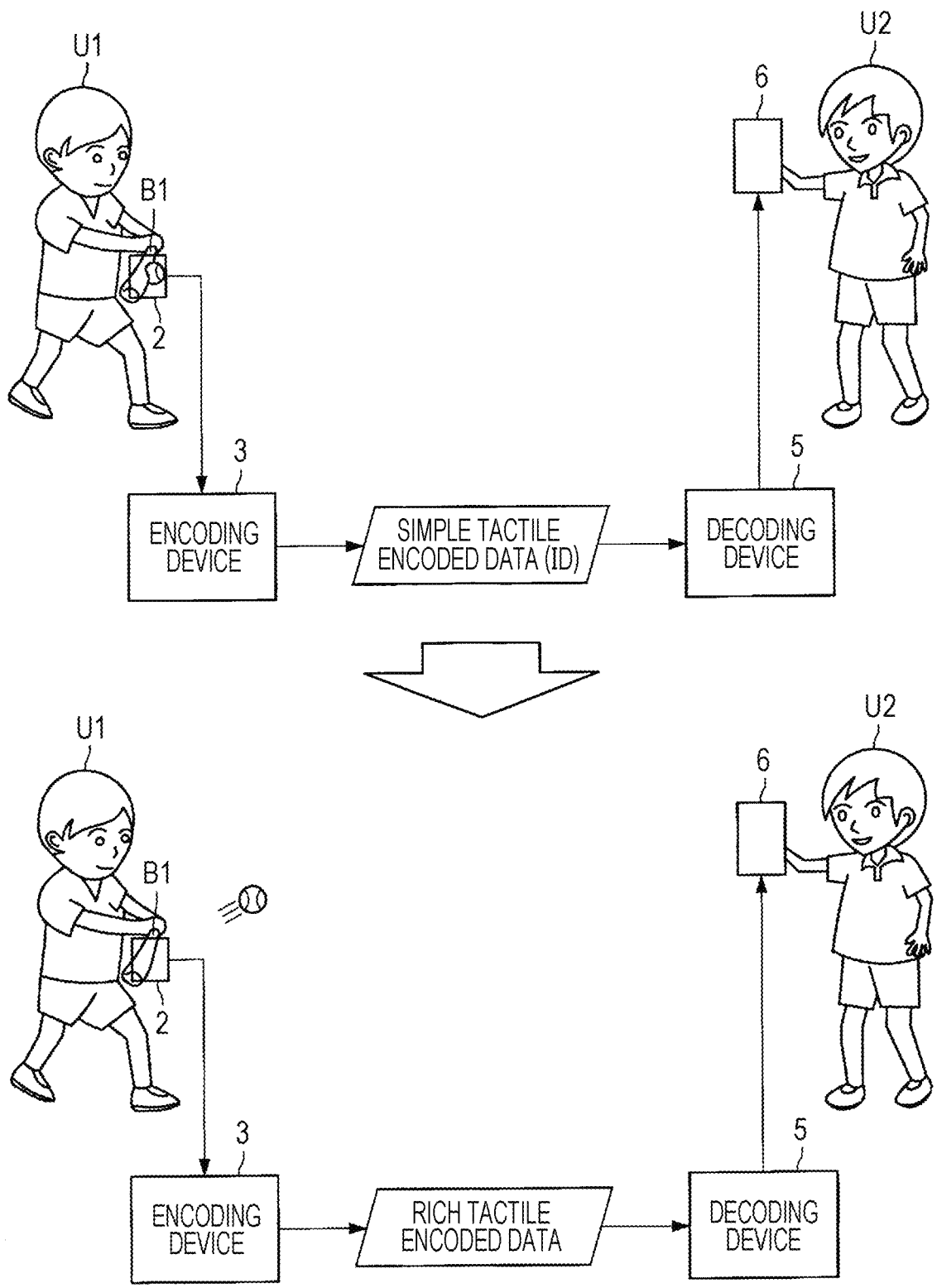
FIG. 9 is a diagram for describing a specific example of a tactile presentation in a case where a simple tactile signal SS according to the embodiment is identification information.

FIG. 9 is a diagram for describing a specific example of the tactile presentation in a case where the simple tactile signal SS according to the present embodiment is identification information. FIG. 9 shows a user U1 holding an object B1 equipped with the tactile sensor 2 and a user U2 wearing the tactile presentation device 6.

On the upper side of FIG. 9, when the user U1 hits a ball with the object B1, which is a bat, the tactile sensor 2 provided in the object B1 detects an impact, and the impact is transmitted as a tactile signal TS to the encoding device 3. The encoding device 3 generates and encodes corresponding identification information as a simple tactile signal SS on the basis of a rise or a predetermined beginning segment in the first amplitude of the tactile signal TS that has been transmitted from the tactile sensor 2. The encoding device 3 transmits to the decoding device 5, the transmission and reception data TD including the simple tactile encoded data SDC in which the simple tactile signal SS has been encoded.

The decoding device 5 acquires various data from the transmission and reception data TD that has been received from the encoding device 3. The decoding device 5 decodes the simple tactile encoded data SDC that has been acquired from the transmission and reception data TD that has been received, and generates a simple tactile signal SS. The decoding device 5 generates the beginning segment of the tactile signal TS corresponding to the simple tactile signal SS that has been generated (that is, identification information), and transmits the beginning segment that has been generated to the tactile presentation device 6. The tactile presentation device 6 presents the beginning segment of the tactile signal TS that has been transmitted from the decoding device 5 to the user U2, who is a watcher.

On the other hand, on the lower side of FIG. 9, the encoding device 3 encodes the segment other than the beginning of the tactile signal TS to generate a rich tactile signal RS. After transmitting the simple tactile encoded data SDC, the encoding device 3 transmits the transmission and reception data TD including the rich tactile encoded data RDC to the decoding device 5. The decoding device 5 acquires and performs a decoding process on the rich tactile encoded data RDC on the basis of the transmission and reception data TD that has been received from the encoding device 3, and generates the rich tactile signal RS. The decoding device 5 generates the segment other than the beginning of the tactile signal TS to be presented, on the basis of the rich tactile signal RS that has been generated.

By transmitting and receiving the simple tactile encoded data SDC in this manner, while maintaining the quality of the tactile signal as a whole, the tactile presentation is enabled at a timing closer to the timing when the object B1, which is a bat, hits a ball than that of the case where the encoded data in which the beginning segment of the tactile signal TS has been subject to the general waveform encoding is transmitted and received.

Further, the scenes on which the user U has the tactile experience include a tactile experience by a technique called teletouch, by which an object that has been touched by a robot arm that moves according to a movement of a hand of the user U is sensed as a tactile sensation. For example, the user U senses a force sensed as a repulsive force when touching an object, with a tactile sensation. Therefore, by conveying a force that is received when the robot arm touches the object to the user U as the tactile sensation, the user U can have a tactile experience as if the user U were touching the object remotely. In addition, when the type of the object being touched by the robot arm changes, the force received as a repulsive force also changes. By providing a tactile presentation with a low delay at an occurrence of such a change, the possibility that the tactile experience of the user U is impaired is lower.

Figure 10:
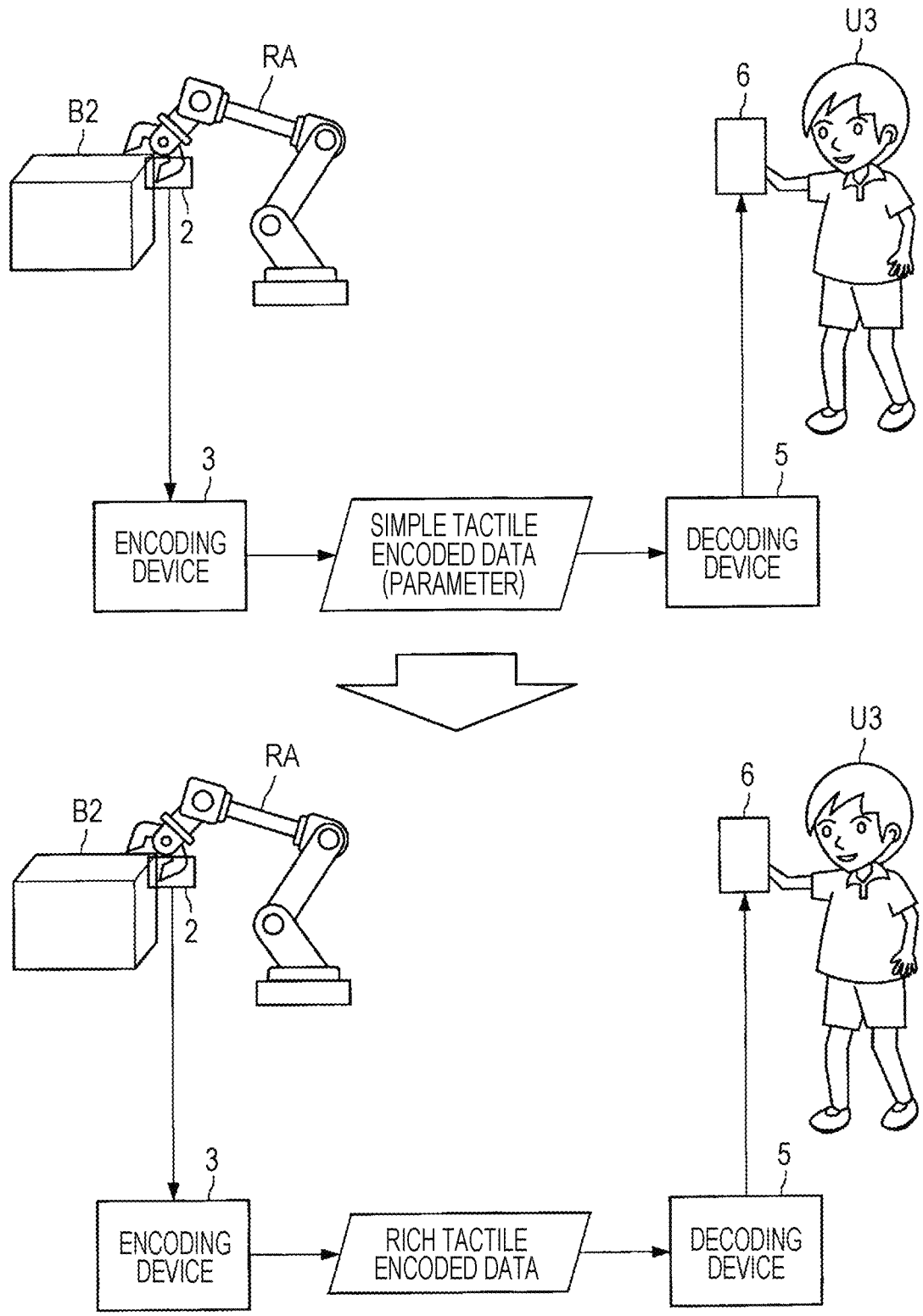
FIG. 10 is a diagram for describing a specific example of the tactile presentation in a case where the simple tactile signal SS according to the embodiment is a parameter.

FIG. 10 is a diagram for describing a specific example of the tactile presentation in a case where the simple tactile signal SS according to the present embodiment is a parameter. FIG. 10 shows a robot arm RA, which is equipped with the tactile sensor 2 and which is touching an object B2, and a user U2, who is wearing the tactile presentation device 6.

On the upper side of FIG. 10, regarding the transmission and reception of the tactile signal TS, it is different from the example of FIG. 9 in that the simple tactile signal SS is a parameter of the beginning segment of the tactile signal TS. The tactile sensor 2 detects the force received when the robot arm RA touches the object B2 as a tactile signal TS, and the encoding device 3 generates a parameter as a simple tactile signal SS on the basis of the beginning segment of the tactile signal TS. Further, the encoding device 3 performs an encoding process on the parameter that has been generated according to the frame format FF of the transmission and reception data TD, and transmits to the decoding device 5, the transmission and reception data TD including the simple tactile encoded data SDC, which is a result of the encoding, and other information.

The decoding device 5 acquires the simple tactile encoded data SDC from the transmission and reception data TD that has been received, and performs a decoding process on the simple tactile encoded data SDC to generate a parameter that is a simple tactile signal SS. The decoding device 5 generates the beginning segment of the tactile signal TS to be presented, on the basis of the parameter that has been generated. Here, the parameter to be generated is extracted from the waveform of the beginning segment of the tactile signal TS, which has been detected by the tactile sensor 2. Therefore, the tactile stimulus presented by the tactile signal TS generated on the basis of the parameter can give the user U a tactile sensation specific to the material of the object that the robot arm RA has touched. It is to be noted that the presentation of segments other than the beginning of the tactile signal TS by transmitting and receiving the transmission and reception data TD including the rich tactile encoded data RDC on the lower side of FIG. 9 is similar to FIG. 9.

Additionally, the scenes on which the user U has the tactile experience include touching of a virtual object in a virtual space in a vertual reality (VR) content. For example, when the user U touches a virtual object VB via a virtual character VC in the virtual space, the tactile presentation device 6 gives the user U a tactile stimulus, so as to enable a further improvement in the reality feeling of the experience of the user U in the virtual space.

Figure 11:
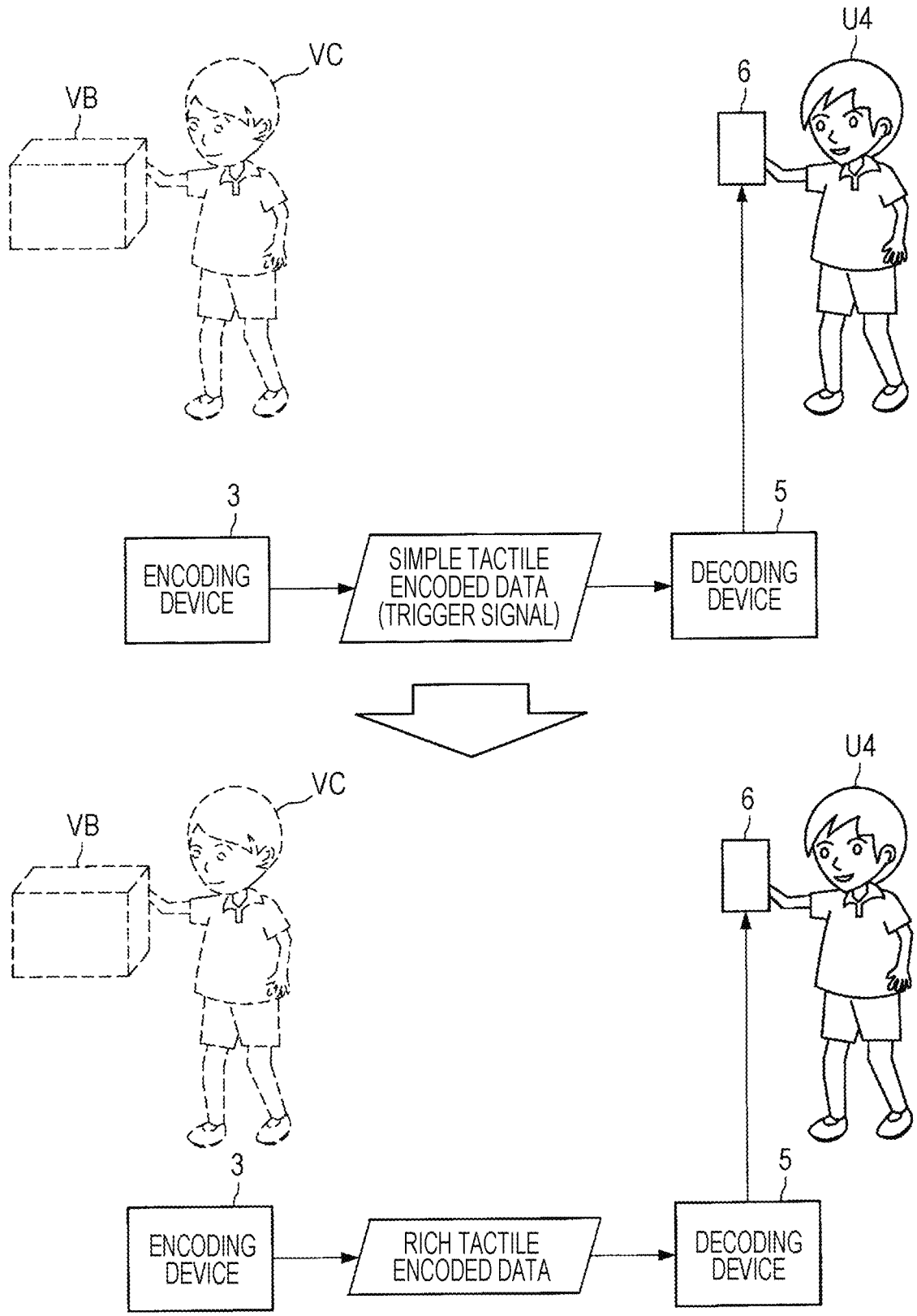
FIG. 11 is a diagram for describing a specific example of the tactile presentation in a case where the simple tactile signal SS according to the embodiment is a trigger signal.

FIG. 11 is a diagram for describing a specific example of the tactile presentation in a case where the simple tactile signal SS according to the present embodiment is a trigger signal. FIG. 11 shows a virtual character VC, which is touching the virtual object VB, and a user U4, who is wearing the tactile presentation device 6.

On the upper side of FIG. 11, the simple tactile signal SS is a trigger signal. Due to touching the virtual object VB in the virtual space, the encoding device 3 transmits to the decoding device 5, the transmission and reception data TD including other information as the simple tactile encoded data SDC in which the trigger signal indicating the touching of the object has been encoded.

The decoding device 5 acquires the simple tactile encoded data SDC from the transmission and reception data TD that has been received, and performs a decoding process on the simple tactile encoded data SDC to generate a trigger signal that is a simple tactile signal SS. The decoding device 5 generates the beginning segment of the tactile signal TS to be presented, on the basis of the trigger signal that has been generated.

On the other hand, on the lower side of FIG. 11, the encoding device 3 encodes the segment other than the beginning of the tactile signal TS to generate a rich tactile signal RS. After transmitting the transmission and reception data TD including the simple tactile encoded data SDC, the encoding device 3 transmits the transmission and reception data TD including the rich tactile encoded data RDC to the decoding device 5. The decoding device 5 generates the segment other than the beginning of the tactile signal TS to be presented, on the basis of the rich tactile signal RS that has been generated.

It is to be noted that the vibration in the segment other than the beginning of the tactile signal TS may be calculated with a movement of the virtual character VC in synchronization with the movement of the user U4 by a motion capture technology and the positional relationship of the virtual object VB. Alternatively, the vibration in the segment other than the beginning of the tactile signal TS may be a vibration to be stored as a preset signal in the encoding device 3. Here, in a case where the positional relationship is in a predetermined state, the virtual character VC is in a state of performing a predetermined operation, or the like, the encoding device 3 may not necessarily transmit the rich tactile encoded data RDC to the decoding device 5.

Heretofore, the specific scenes in the transmission and presentation of the tactile signal TS by the tactile presentation system 1 have been described. In this manner, by transmitting the tactile signal TS by means of the simple tactile signal SS on various scenes, both a low delay in the presentation start of the tactile signal TS and the quality of the entire tactile experience are enabled.

Heretofore, by the way, the description has been given with regard to the example in which the beginning segment of the tactile signal TS is presented to the user U, and then the segment other than the beginning is presented to the user U. However, in a case where the vibration detected by the tactile sensor 2 is present locally in time, only the beginning segment of the tactile signal TS may be transmitted and received depending on the vibration pattern of the tactile signal TS.

That is, the encoding device 3 may not necessarily transmit the rich tactile encoded data RDC, and may transmit to the decoding device 5, the simple tactile encoded data SDC in which the simple tactile signal SS indicating the beginning segment of a certain tactile signal TS has been encoded. Next, the simple tactile encoded data SDC in which the simple tactile signal SS indicating the beginning segment of another tactile signal TS has been encoded may be transmitted to the decoding device 5. This is because the presentation of only the beginning segment of the tactile signal TS causes no problem, in a case where the tactile stimulus is so short in time that it is difficult for the user U to feel the quality of vibration. Alternatively, the encoding device 3 may encode the entirety including the segment other than the beginning of the tactile signal TS in an encoding method corresponding to the simple tactile signal SS, and transmits the entirety to the decoding device 5.

Figure 12:
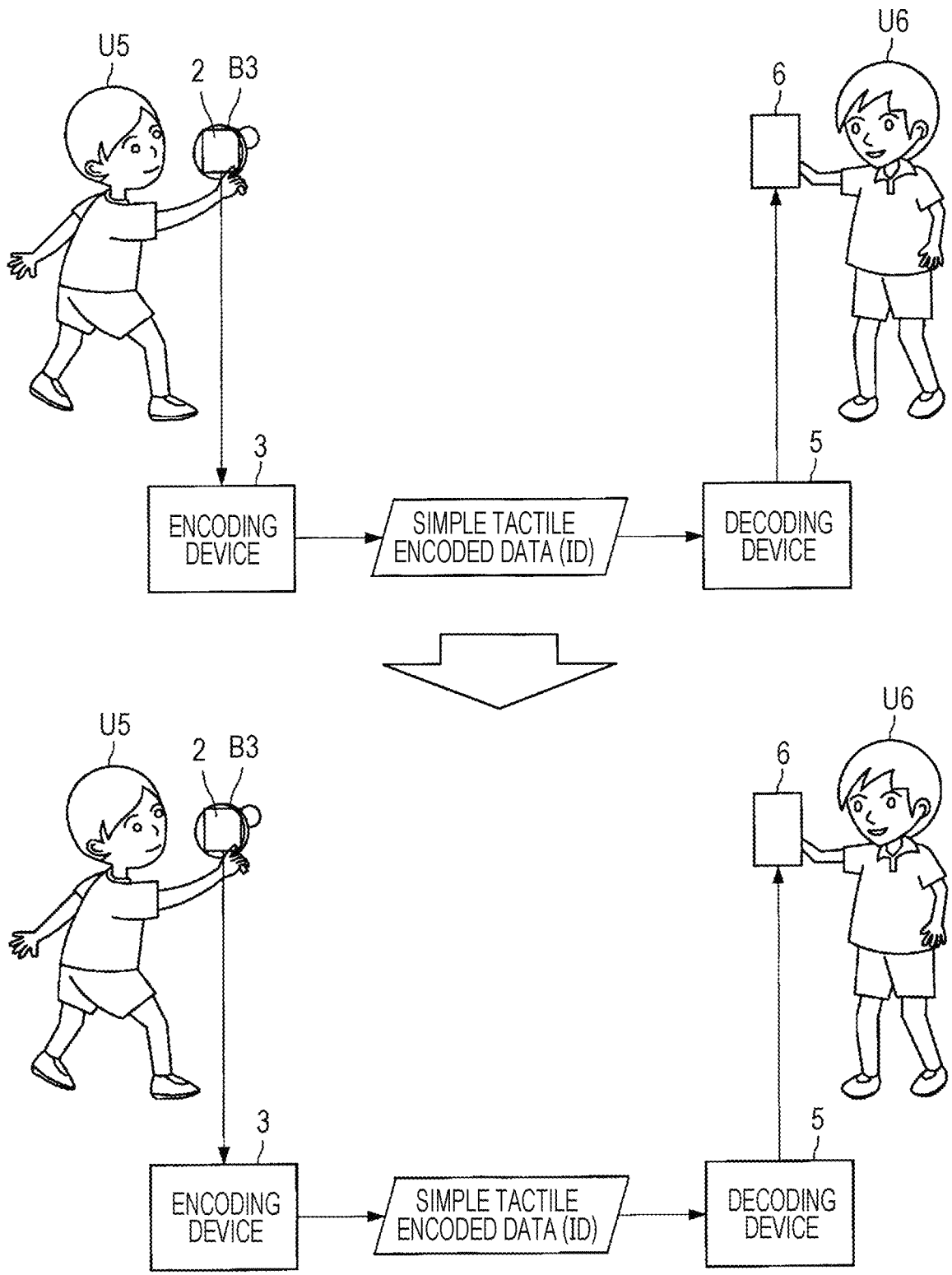
FIG. 12 is a diagram for describing a specific example of the tactile presentation in a case where only simple tactile encoded data SDC according to the embodiment is transmitted and received.

FIG. 12 is a diagram for describing a specific example of the tactile presentation in a case where only the simple tactile encoded data SDC according to the present embodiment is transmitted and received. FIG. 12 shows a user U5, who is holding an object B3, which is a table tennis racket equipped with the tactile sensor 2, and a user U6, who is wearing the tactile presentation device 6.

On the upper side of FIG. 12, in a case where the user U5 hits a ball with the object B3, which is the table tennis racket, the encoding device 3 generates and encodes the corresponding identification information as a simple tactile signal SS on the basis of the tactile signal TS that has been transmitted from the tactile sensor 2. The encoding device 3 transmits to the decoding device 5, the transmission and reception data TD including the simple tactile encoded data SDC in which the simple tactile signal SS has been encoded.

The decoding device 5 acquires various data from the transmission and reception data TD that has been received from the encoding device 3. The decoding device 5 decodes the simple tactile encoded data SDC that has been acquired from the transmission and reception data TD that has been received, and generates a simple tactile signal SS. The decoding device 5 generates a tactile signal TS corresponding the simple tactile signal SS that has been generated, that is, the identification information, and transmits the tactile signal TS that has been generated to the tactile presentation device 6. The tactile presentation device 6 presents the tactile signal TS that has been transmitted from the decoding device 5 to the user U2, who is a watcher.

On the lower side of FIG. 12, when the user U5 hits a ball with the object B3, which is a table tennis racket, the encoding device 3 transmits the simple tactile encoded data SDC similar to the upper side of FIG. 12 to the decoding device 5. It is to be noted that the encoding device 3 may transmit to the decoding device 5, the simple tactile encoded data SDC indicating different identification information (ID) on the basis of a difference in how the ball is hit by the object B3, that is, a difference in vibration that has been detected by the tactile sensor 2.

In this manner, by transmitting and receiving only the transmission and reception data TD including the simple tactile encoded data SDC according to the type of the tactile signal TS, a further reduction in the amount of data to be transmitted and received is enabled without impairing the tactile experience of the user U.

It is to be noted that the combinations of the various scenes that have been described above and the simple tactile signal SS are examples, and such examples are non-limiting ones.

<<2.4. Operation Example>>

Figure 13:
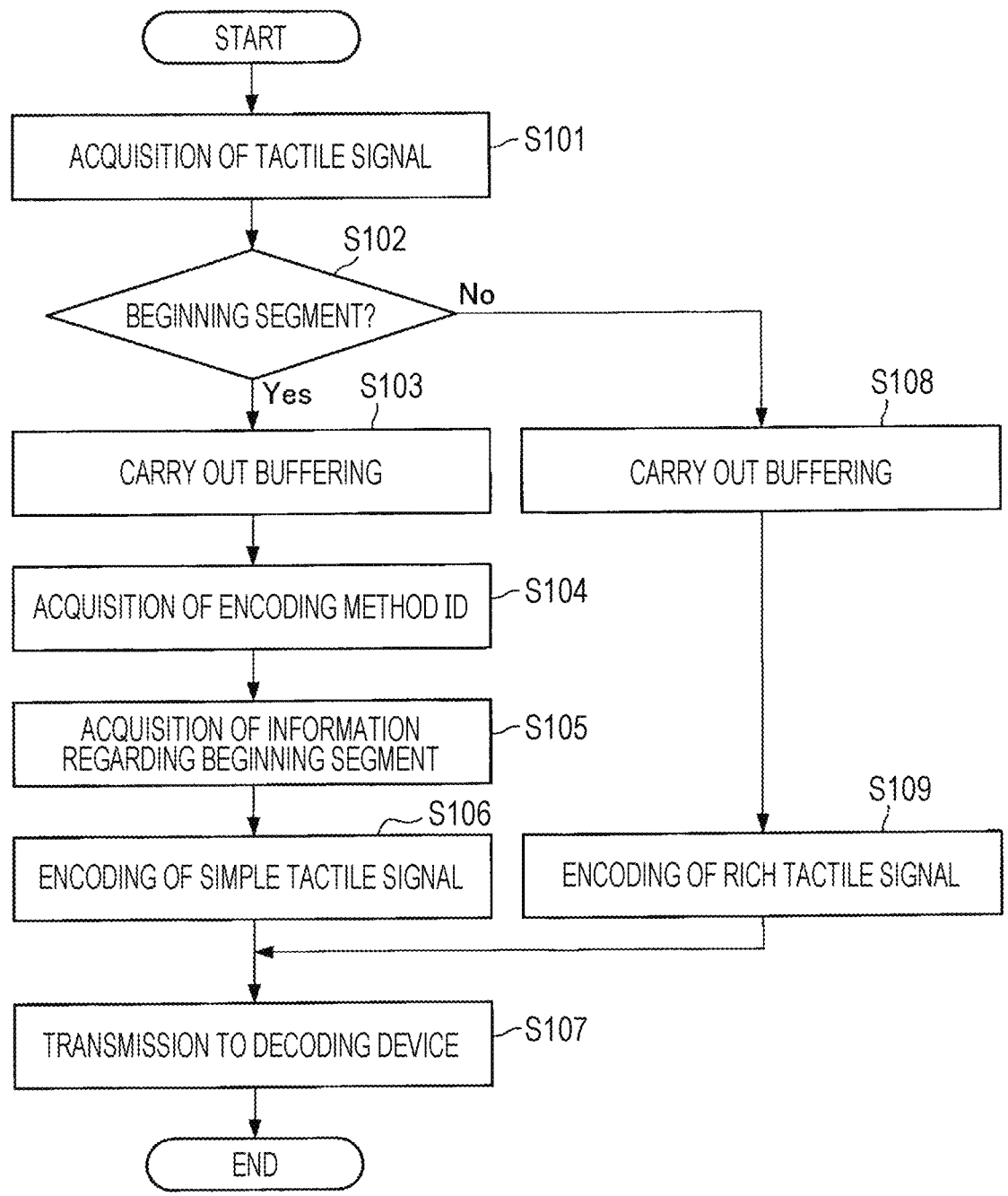
FIG. 13 is a diagram for describing an example of an operation flow of the encoding device 3 according to the embodiment.
Figure 14:
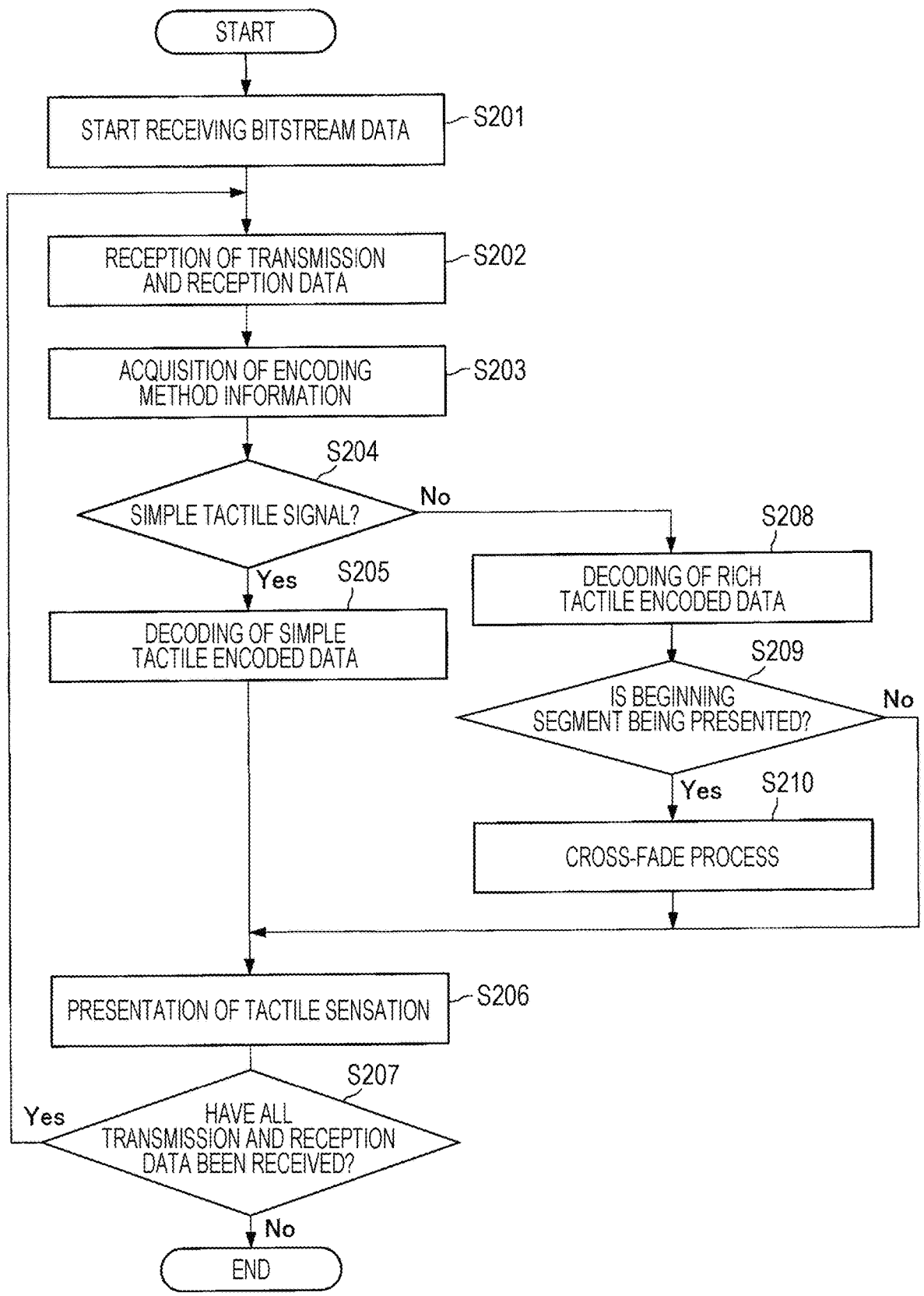
FIG. 14 is a diagram for describing an example of an operation flow of the decoding device 5 according to the embodiment.

Subsequently, examples of operation flows of the encoding device 3 and the decoding device 5 according to the present embodiment will be described with reference to FIGS. 13 and 14.

First, an example of the operation flow of the encoding device 3 will be described. FIG. 13 is a diagram for describing the example of the operation flow of the encoding device 3 according to the present embodiment. Referring to FIG. 13, first, the encoding unit 34 receives the tactile signal TS from the tactile sensor 2, and performs various processes (S101). Specifically, the amplification unit 31, the A/D conversion unit 32, and the pre-processing unit 33 of the encoding device 3 perform various processes on the tactile signal TS, and sequentially transmit the tactile signal TS to the encoding unit 34.

Next, in a case where the segment of the tactile signal TS that has been received by the encoding unit 34 from the pre-processing unit 33 is a beginning segment (S102: Yes), the communication unit 51 buffers the beginning segment of the tactile signal TS (S103). Next, the encoding unit 34 acquires an encoding method ID corresponding to the beginning segment of the tactile signal TS buffered in step S103 (S104). Specifically, an ID indicating that the encoded data to be transmitted is the simple tactile encoded data SDC is acquired. Next, the encoding unit 34 acquires information such as a parameter as the simple tactile signal SS from the beginning segment of the tactile signal TS (S105). Next, the encoding unit 34 encodes the simple tactile signal SS acquired in step S105 (S106). Next, the communication unit 35 transmits to the decoding device 5, the simple tactile encoded data SDC generated by being encoded in step S106 as transmission and reception data TD including other information (S107), and the operation of the encoding device 3 ends.

On the other hand, in a case where the segment of the tactile signal TS that has been received by the encoding unit 34 from the pre-processing unit 33 is a segment other than the beginning (S102: No), the communication unit 51 buffers the segment other than the beginning of the tactile signal TS (S108). Next, the encoding unit 34 encodes the rich tactile signal RS acquired in step S108 (S109). Next, the communication unit 35 transmits to the decoding device 5, the rich tactile encoded data RDC generated by being encoded in step S109 as the transmission and reception data TD including other information (S107), and the operation of the encoding device 3 ends.

Next, an example of the operation flow of the decoding device 5 will be described. FIG. 14 is a diagram for describing the example of the operation flow of the decoding device 5 according to the present embodiment. Referring to FIG. 14, first, the communication unit 51 starts receiving bitstream data from the encoding device 3 (S201). Next, the communication unit 51 receives the transmission and reception data TD from the encoding device 3 (S202). Next, the determination unit 52 acquires information indicating the encoding method from the transmission and reception data TD received in step S202 (S203). In a case where the information acquired in step S203 indicates the encoding method of the simple tactile signal SS (S204: Yes), the decoding unit 53 decodes the simple tactile encoded data SDC included in the transmission and reception data TD received in step S202 (S205). Next, the decoding device 5 performs various processes on the basis of the simple tactile signal SS generated in step S202, transmits the beginning segment of the tactile signal TS to the tactile presentation device for presentation (S206), and in a case where the reception of the transmission and reception data TD continues (S207: Yes), the process returns to step S202, and in a case where the reception of the transmission and reception data TD does not continue (S207: No), the decoding device 5 ends the operation.

On the other hand, in a case where the information acquired in step S203 indicates the encoding method of the simple tactile signal SS (S204: No), the decoding unit 53 decodes the rich tactile encoded data RDC included in the transmission and reception data TD received in step S202 (S208). Next, in a case where the decoding device 5 is presenting the beginning segment of the tactile signal TS to the tactile presentation device 6 (S209: Yes), the signal control unit 56 performs the cross-fade process (S210). The decoding device 5 performs various processes on the basis of the simple tactile signal SS generated in step S202, transmits the segment other than the beginning of the tactile signal TS to the tactile presentation device for presentation (S206). In a case where the reception of the transmission and reception data TD continues (S207: Yes), the process returns to step S202, and in a case where the reception of the transmission and reception data TD does not continue (S207: No), the decoding device 5 ends the operation.

On the other hand, in a case where the decoding device 5 is not presenting the beginning segment of the tactile signal TS to the tactile presentation device 6 (S209: No), step S206 is performed. In a case where the reception of the transmission and reception data TD continues (S207: Yes) the process returns to step S202, and in a case where the reception of the transmission and reception data TD does not continue (S207: No), the decoding device 5 ends the operation.

<<2.5. Modification Example>>

Subsequently, modification examples according to the present embodiment will be described.

Heretofore, the description has been given with regard to the example in which the encoding method corresponding to the simple tactile signal SS is applied to the beginning segment of the tactile signal TS. As described above, by applying to the beginning segment of the tactile signal TS, a further reduction is enabled in a delay at the timing when the tactile stimulus starts to be given with respect to the vibration of the tactile stimulus to be recorded. However, the situation in which the timing of giving the tactile stimulus is important is not limited to starting to give the tactile stimulus.

For example, even in a situation in which the amplitude of the tactile signal TS changes suddenly, the timing of giving the tactile stimulus is important. There is a high possibility that a sudden change or a disappearance of the tactile sensation for a user U is related to a change in the situation on a recording side. In a case where the sudden change in the tactile sensation and the change in the situation on the recording side cannot be in synchronization with each other, a situation in which the real-time property of the tactile presentation is lost may occur, and there is a possibility that the user feels a sense of incongruity with respect to the tactile sensation that has been presented.

For such a reason, the encoding method corresponding to the simple tactile signal SS may be applied to the segment different from the beginning segment of the tactile signal TS. Specifically, in a case where there is an amplitude change equal to or larger than a predetermined value in the segment other than the beginning of the tactile signal TS, the encoding device 3 may encode the tactile signal TS in the segment representing the amplitude change equal to or larger than the predetermined value in an encoding method similar to the encoding method corresponding to the simple tactile signal SS to generate amplitude change encoded data. On the other hand, in a case where the decoding device 5 has received the amplitude change encoded data from the encoding device 3 while the decoding device 5 is causing the tactile presentation device 6 to present the segment other than the beginning of the tactile signal TS, the decoding unit 53 may decode the amplitude change encoded data in an encoding method similar to that for the simple tactile encoded data SDC.

More specifically, in a case where the amplitude of the tactile signal TS exceeds a root mean square of a peak value of the amplitude in a predetermined segment, the tactile signal TS in the segment, the amplitude of which exceeds the root mean square of the peak value of the amplitude in the predetermined segment, may be encoded in an encoding method similar to the encoding method corresponding to the simple tactile signal SS. For example, a segment in which the peak value of the tactile signal TS exceeds a threshold value with a weighted average of the peak value of the tactile signal TS in a predetermined segment used as a reference may be set to the sudden change in the amplitude, that is, a rise. In addition, the encoding unit 34 may set the sudden change in the amplitude, that is, a rise, in a case where the peak value of the tactile signal TS in the predetermined segment exceeds a predetermined threshold value. It is to be noted that the above-described predetermined segment and predetermined threshold value may be determined according to a change in the amplitude of the tactile signal TS that is detectable by the tactile sensor 2.

Figure 15:
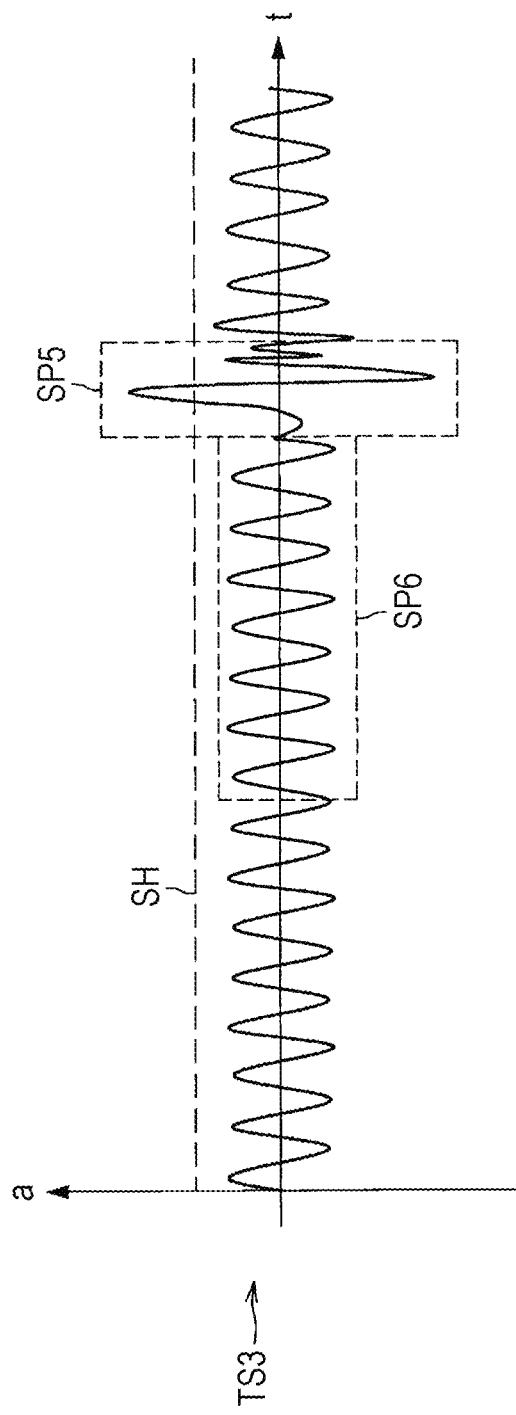
FIG. 15 is a diagram for describing an application of an encoding method corresponding to the simple tactile signal SS accompanied by a sudden change in the amplitude of the tactile signal TS according to a modification example of the present disclosure.

Here, with reference to FIG. 15, a description will be given with regard to an application of the encoding method corresponding to the simple tactile signal SS accompanied by the sudden change in the amplitude of the tactile signal TS. FIG. 15 is a diagram for describing the application of the encoding method corresponding to the simple tactile signal SS accompanied by the sudden change in the amplitude of the tactile signal TS according to a modification example of the present disclosure.

FIG. 15 shows a tactile signal TS3, the amplitude of which changes suddenly in a predetermined segment. An example of FIG. 15 will be described. The encoding unit 34 may encode a segment SP5 of a tactile signal TS3 in an encoding method corresponding to the simple tactile signal SS, on the basis of the fact that the peak value in the segment SP5 of the tactile signal TS3, the amplitude of which changes suddenly, is higher than the peak value in an immediately previous segment SP6 of the tactile signal TS3. It is to be noted that the encoding unit 34 encodes the segment SP5 of the tactile signal TS3 in an encoding method corresponding to the simple tactile signal SS on the basis of the fact that the peak value of the immediately previous segment SP6 of the tactile signal TS3 exceeds a threshold value SH.

In this manner, by appropriately applying the encoding method similar to the encoding method of the simple tactile signal SS on the basis of the change in the amplitude of the tactile signal TS, the presentation of a more diverse tactile experience is enabled without degrading the quality.

<3. Hardware Configuration Example>

Figure 16:
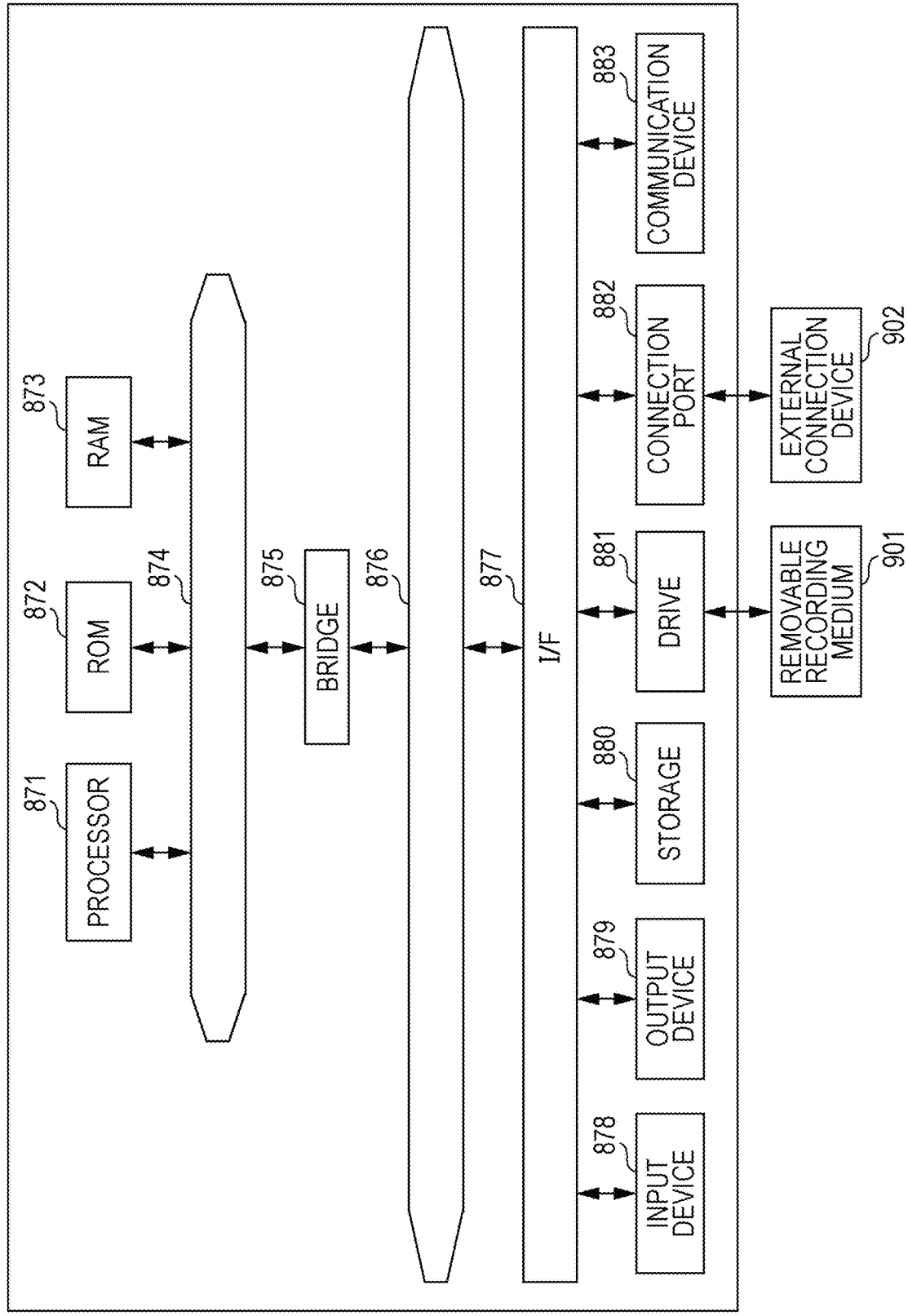
FIG. 16 is a block diagram showing a hardware configuration example of the encoding device 3 and the decoding device 5 according to an embodiment of the present disclosure.

Next, a hardware configuration example common to the encoding device 3 and the decoding device 5 according to an embodiment of the present disclosure will be described. FIG. 16 is a block diagram showing a hardware configuration example of the encoding device 3 and the decoding device 5 according to an embodiment of the present disclosure. Referring to FIG. 16, the encoding device 3 and the decoding device 5 include, for example, a processor 871, a ROM 872, a RAM 873, a host bus 874, a bridge 875, an external bus 876, an interface 877, and an input device 878, an output device 879, a storage 880, a drive 881, a connection port 882, and a communication device 883. It is to be noted that the hardware configuration shown here is an example, and some of the components may be omitted. In addition, components other than the components shown here may be further included.

(Processor 871)

The processor 871 functions as, for example, an arithmetic processing unit or a control device, and controls all or a part of an operation of each component on the basis of various programs recorded in the ROM 872, the RAM 873, the storage 880, or a removable recording medium 901.

(ROM872, RAM873)

The ROM 872 is a means for storing programs to be read into the processor 871, data used for arithmetic processing, and the like. The RAM 873 temporarily or permanently stores, for example, a program to be read by the processor 871, various parameters that change as appropriate when the program is performed, and the like.

(Host Bus 874, Bridge 875, External Bus 876, Interface 877)

The processors 871, the ROM 872, and the RAM 873 are connected to one another through, for example, a host bus 874 enabling high-speed data transmission. On the other hand, the host bus 874 is connected with the external bus 876, data transmission speed of which is relatively low, through the bridge 875, for example. In addition, the external bus 876 is connected with various components through the interface 877.

(Input Device 878)

For the input device 878, for example, a mouse, a keyboard, a touch panel, a button, a switch, a lever, and the like are used. Moreover, for the input device 878, a remote controller (hereinafter referred to as a remote control) capable of transmitting a control signal using infrared rays or other radio waves may be used. Further, the input device 878 includes a voice input device such as a microphone.

(Output device 879)

The output device 879 is a device capable of visually or audibly notifying a user of information that has been acquired, for example, a display device such as a cathode ray tube (CRT), an LCD, or an organic EL, an audio output device such as a speaker or a headphone, a printer, a mobile telephone, a facsimile, or the like. Further, the output device 879 according to the present disclosure includes various vibration devices capable of outputting tactile stimuli.

(Storage 880)

The storage 880 is a device for storing various types of data. For the storage 880, for example, a magnetic storage device such as a hard disk drive (HDD), a semiconductor storage device, an optical storage device, an optical magnetic storage device, or the like is used.

(Drive 881)

The drive 881 is a device for reading information recorded on the removable recording medium 901, for example, a magnetic disk, an optical disk, a magneto-optical disk, a semiconductor memory, or the like, or for writing information into the removable recording medium 901.

(Removable recording medium 901)

The removable recording medium 901 is, for example, a DVD media, a Blu-ray (registered trademark) media, an HD DVD media, various semiconductor storage media, and the like. It is a matter of course that the removable recording medium 901 may be, for example, an IC card equipped with a non-contact IC chip, an electronic device, or the like.

(Connection port 882)

The connection port 882 is a port for connecting an external connection device 902, for example, a universal serial bus (USB) port, an IEEE 1394 port, a small computer system interface (SCSI), an RS-232C port, an optical audio terminal, or the like.

(External Connection Device 902)

The external connection device 902 is, for example, a printer, a portable music player, a digital camera, a digital video camera, an IC recorder, or the like.

(Communication device 883)

The communication device 883 is a communication device for making a connection with a network, for example, a communication card for wired or wireless LAN, Bluetooth (registered trademark), or wireless USB (WUSB), a router for optical communication, a router for asymmetric digital subscriber line (ADSL), modems for various types of communication, or the like.

<4. Conclusion>

As described heretofore, by encoding the tactile signal TS in a plurality of encoding methods and transmitting and receiving the encoded data, both quality maintenance of a tactile sensation presented to a user and a low delay in the tactile signal transmission are enabled.

Although the preferred embodiments of the present disclosure have been described in detail with reference to the accompanying drawings, the technical scope of the present disclosure is not limited to such examples. It is clear that anyone with ordinary knowledge in the technical field of the present disclosure may come up with various changed examples or modified examples within the scope of the technical ideas set forth in the claims. It is naturally understood that they belong to the technical scope of the present disclosure.

In addition, the effects described herein are merely explanatory or exemplary, and are not limited. That is, the techniques according to the present disclosure may exhibit other effects apparent to those skilled in the art from the description herein, in addition to or in place of the above effects.

It is to be noted that the following configurations also belong to the technical scope of the present disclosure.

(1)

A decoding device including a decoding unit configured to decode a plurality of pieces of encoded data on the basis of encoding method information that has been received, received bitstream data including the plurality of pieces of encoded data in which a plurality of segments of a tactile signal has been respectively encoded, in which the encoding method information includes information indicating in which encoding method of a plurality of encoding methods the respective segments of the tactile signal have been encoded, the plurality of encoding methods includes a simple tactile encoding method corresponding to a simple tactile signal related to a beginning segment of the tactile signal, the plurality of pieces of encoded data includes simple tactile encoded data in which the simple tactile signal has been encoded in the simple tactile encoding method, and the decoding unit decodes the simple tactile encoded data, in a case where the encoding method information indicates the simple tactile encoding method.

(2)

The decoding device described in the above (1), in which the plurality of encoding methods includes a rich tactile encoding method corresponding to a rich tactile signal related to a segment other than a beginning of the tactile signal, the plurality of pieces of encoded data includes rich tactile encoded data in which the rich tactile signal has been encoded in the rich tactile encoding method, and in a case where the encoding method information indicates the rich tactile encoding method, the decoding unit decodes the rich tactile encoded data.

(3)

The decoding device described in the above (1) or (2), further including a signal generation unit configured to generate the tactile signal in a segment corresponding to a decoding result on the basis of the decoding result by the decoding unit with respect to the encoded data.

(4)

The decoding device described in the above (3), in which the simple tactile signal includes a trigger signal for giving an instruction on a presentation of the beginning segment of the tactile signal, and in a case where the decoding result by the decoding unit indicates the trigger signal, the signal generation unit generates the beginning segment of the tactile signal corresponding to the trigger signal.

(5)

The decoding device described in the above (3), in which the simple tactile signal includes a signal indicating a parameter of the beginning segment of the tactile signal, and in a case where the decoding result by the decoding unit indicates the parameter of the beginning segment of the tactile signal, the signal generation unit generates the beginning segment of the tactile signal on the basis of the parameter of the beginning segment of the tactile signal.

(6)

The decoding device described in the above (5), in which the parameter of the beginning segment of the tactile signal includes a feature amount of the beginning segment of the tactile signal, and the signal generation unit generates the beginning segment of the tactile signal corresponding to the feature amount on the basis of the feature amount of the beginning segment of the tactile signal.

(7)

The decoding device described in the above (5), in which the parameter of the beginning segment of the tactile signal includes a parameter of an attenuated sinusoidal signal, and the signal generation unit generates the attenuated sinusoidal signal corresponding to the parameter on the basis of the parameter of the attenuated sinusoidal signal.

(8)

The decoding device described in the above (3), in which the simple tactile signal includes a signal indicating identification information of the beginning segment of the tactile signal, and the signal generation unit generates the beginning segment of the tactile signal corresponding to the identification information of the beginning segment of the tactile signal.

(9)

The decoding device described in any one of the above (2) to (8), in which the rich tactile signal includes the segment other than the beginning of the tactile signal, and the decoding unit decodes the rich tactile encoded data, and generates the segment other than the beginning of the tactile signal.

(10)

The decoding device described in any one of the above (2) to (9), in which the rich tactile encoding method includes a waveform encoding method, and the decoding unit decodes the rich tactile encoded data that has been encoded by the waveform encoding method.

(11)

The decoding device described in any one of the above (2) to (10), further including a signal control unit configured to switch the tactile signal to be presented to a user.

(12)

The decoding device described in the above (11), in which the signal control unit switches the tactile signal to be presented to the user by a cross-fade process.

(13)

The decoding device described in the above (12), in which the signal control unit switches the tactile signal to be presented to the user by the cross-fade process, only in a case of switching from the tactile signal corresponding to the simple tactile signal to the tactile signal corresponding to the rich tactile signal.

(14)

The decoding device described in any one of the above (1) to (13), in which the plurality of pieces of encoded data includes a plurality of the simple tactile encoded data that has been generated by performing encoding in the encoding method of corresponding each signal of the plurality of the simple tactile signals to the simple tactile signal, and the decoding unit decodes a plurality of the simple tactile encoded data on the basis of information indicating the encoding method corresponding to the plurality of the simple tactile signals that has been received.

(15)

The decoding device described in any one of the above (1) to (14), in which in a case where an amplitude change equal to or larger than a predetermined value in a segment other than a beginning of the tactile signal is present, the plurality of pieces of encoded data includes amplitude change encoded data, in which the tactile signal in the segment indicating the amplitude change equal to or larger than the predetermined value has been encoded in the simple tactile encoding method, and in a case where a segment indicating a waveform change equal to or larger than the predetermined value that has been received having been encoded in the simple tactile encoding method is indicated by the encoding method information that has been received, the decoding unit decodes the amplitude change encoded data.

(16)

The decoding device described in the above (15), in which the amplitude change equal to or larger than the predetermined value means that a peak value of an amplitude exceeds a root mean square of the peak value of the amplitude in a predetermined segment, the plurality of pieces of encoded data includes the amplitude change encoded data in which the tactile signal in a segment, in which the peak value of the amplitude exceeds the root mean square of the peak value of the amplitude in the predetermined segment, has been encoded in the encoding method similar to the encoding method corresponding to the simple tactile signal, and in a case where the segment, in which the peak value of the amplitude that has been received exceeds the root mean square of the peak value of the amplitude in the predetermined segment, having been encoded in the simple tactile encoding method is indicated by the encoding method information that has been received, the decoding unit decodes the amplitude change encoded data.

(17)

The decoding device described in any one of the above (3) to (16), further including a storage unit configured to store information regarding the beginning segment of the tactile signal, in which the signal generation unit generates the beginning segment of the tactile signal on the basis of the information regarding the beginning segment of the tactile signal.

(18)

The decoding device described in any one of the above (1) to (17), further including a determination unit configured to determine an encoding method for each of the encoded data on the basis of the encoding method information that has been received, in which the decoding unit decodes the each of the encoded data on the basis of the encoding method corresponding to the each of the encoded data that has been determined by the determination unit.

(19)

A decoding method including decoding, by a processor, a plurality of pieces of encoded data on the basis of encoding method information that has been received, received bitstream data including the plurality of pieces of encoded data in which a plurality of segments of a tactile signal has been respectively encoded, in which the encoding method information includes information indicating in which encoding method of a plurality of encoding methods the respective segments of the tactile signal have been encoded, the plurality of encoding methods includes a simple tactile encoding method corresponding to a simple tactile signal related to a beginning segment of the tactile signal, and the plurality of pieces of encoded data includes simple tactile encoded data in which the simple tactile signal has been encoded in the simple tactile encoding method, the decoding method further including decoding the simple tactile encoded data, in a case where the encoding method information indicates the simple tactile encoding method.

(20)

A program causing a computer to function as a decoding device, the decoding device including a decoding unit configured to decode a plurality of pieces of encoded data on the basis of encoding method information that has been received, received bitstream data including the plurality of pieces of encoded data in which a plurality of segments of a tactile signal has been respectively encoded, in which the encoding method information includes information indicating in which encoding method of a plurality of encoding methods the respective segments of the tactile signal have been encoded, the plurality of encoding methods includes a simple tactile encoding method corresponding to a simple tactile signal related to a beginning segment of the tactile signal, the plurality of pieces of encoded data includes simple tactile encoded data in which the simple tactile signal has been encoded in the simple tactile encoding method, and the decoding unit decodes the simple tactile encoded data, in a case where the encoding method information indicates the simple tactile encoding method.

REFERENCE SIGNS LIST

1 Tactile presentation system
2 Tactile sensor
3 Encoding device
31 Amplification unit
32 A/D conversion unit
33 Pre-processing unit
34 Encoding unit
35 Communication unit
36 Control unit
37 Storage unit
4 Network
5 Decoding device
51 Communication unit
52 Determination unit
53 Decoding unit
54 Signal generation unit
55 Storage unit
56 Signal control unit
57 Post-processing unit
58 D/A conversion unit
59 Amplification unit
6 Tactile presentation device

The invention claimed is:

1. A decoding device comprising
a decoding unit configured to decode a plurality of pieces of encoded data on a basis of encoding method information that has been received, received bitstream data including the plurality of pieces of encoded data in which a plurality of segments of a tactile signal has been respectively encoded,
wherein the encoding method information includes information indicating in which encoding method of a plurality of encoding methods the respective segments of the tactile signal have been encoded,
the plurality of encoding methods includes a simple tactile encoding method corresponding to a simple tactile signal related to a beginning segment of the tactile signal,
the plurality of pieces of encoded data includes simple tactile encoded data in which the simple tactile signal has been encoded in the simple tactile encoding method, and
the decoding unit decodes the simple tactile encoded data, in a case where the encoding method information indicates the simple tactile encoding method.

2. The decoding device according to claim 1, wherein the plurality of encoding methods includes a rich tactile encoding method corresponding to a rich tactile signal related to a segment other than a beginning of the tactile signal,
the plurality of pieces of encoded data includes rich tactile encoded data in which the rich tactile signal has been encoded in the rich tactile encoding method, and
in a case where the encoding method information indicates the rich tactile encoding method, the decoding unit decodes the rich tactile encoded data.

3. The decoding device according to claim 2, further comprising
a signal generation unit configured to generate the tactile signal in a segment corresponding to a decoding result on a basis of the decoding result by the decoding unit with respect to the encoded data.

4. The decoding device according to claim 3,
wherein the simple tactile signal includes a trigger signal for giving an instruction on a presentation of the beginning segment of the tactile signal, and
in a case where the decoding result by the decoding unit indicates the trigger signal, the signal generation unit generates the beginning segment of the tactile signal corresponding to the trigger signal.

5. The decoding device according to claim 3,
wherein the simple tactile signal includes a signal indicating a parameter of the beginning segment of the tactile signal, and
in a case where the decoding result by the decoding unit indicates the parameter of the beginning segment of the tactile signal, the signal generation unit generates the beginning segment of the tactile signal on a basis of the parameter of the beginning segment of the tactile signal.

6. The decoding device according to claim 5,
wherein the parameter of the beginning segment of the tactile signal includes a feature amount of the beginning segment of the tactile signal, and
the signal generation unit generates the beginning segment of the tactile signal corresponding to the feature amount on a basis of the feature amount of the beginning segment of the tactile signal.

7. The decoding device according to claim 5,
wherein the parameter of the beginning segment of the tactile signal includes a parameter of an attenuated sinusoidal signal, and
the signal generation unit generates the attenuated sinusoidal signal corresponding to the parameter on a basis of the parameter of the attenuated sinusoidal signal.

8. The decoding device according to claim 3,
wherein the simple tactile signal includes a signal indicating identification information of the beginning segment of the tactile signal, and
the signal generation unit generates the beginning segment of the tactile signal corresponding to the identification information of the beginning segment of the tactile signal.

9. The decoding device according to claim 2,
wherein the rich tactile signal includes the segment other than the beginning of the tactile signal, and
the decoding unit decodes the rich tactile encoded data, and generates the segment other than the beginning of the tactile signal.

10. The decoding device according to claim 2,
wherein the rich tactile encoding method includes a waveform encoding method, and
the decoding unit decodes the rich tactile encoded data that has been encoded by the waveform encoding method.

11. The decoding device according to claim 2, further comprising
a signal control unit configured to switch the tactile signal to be presented to a user.

12. The decoding device according to claim 11,
wherein the signal control unit switches the tactile signal to be presented to the user by a cross-fade process.

13. The decoding device according to claim 12,
wherein the signal control unit switches the tactile signal to be presented to the user by the cross-fade process, only in a case of switching from the tactile signal corresponding to the simple tactile signal to the tactile signal corresponding to the rich tactile signal.

14. The decoding device according to claim 1,
wherein the plurality of pieces of encoded data includes a plurality of the simple tactile encoded data that has been generated by performing encoding in the encoding method of corresponding each signal of the plurality of the simple tactile signals to the simple tactile signal, and
the decoding unit decodes a plurality of the simple tactile encoded data on a basis of information indicating the encoding method corresponding to the plurality of the simple tactile signals that has been received.

15. The decoding device according to claim 1,
wherein in a case where an amplitude change equal to or larger than a predetermined value in a segment other than a beginning of the tactile signal is present, the plurality of pieces of encoded data includes amplitude change encoded data, in which the tactile signal in the segment indicating the amplitude change equal to or larger than the predetermined value has been encoded in the simple tactile encoding method, and
in a case where a segment indicating a waveform change equal to or larger than the predetermined value that has been received having been encoded in the simple tactile encoding method is indicated by the encoding method information that has been received, the decoding unit decodes the amplitude change encoded data.

16. The decoding device according to claim 15,
wherein the amplitude change equal to or larger than the predetermined value means that a peak value of an amplitude exceeds a root mean square of the peak value of the amplitude in a predetermined segment,
the plurality of pieces of encoded data includes the amplitude change encoded data in which the tactile signal in a segment, in which the peak value of the amplitude exceeds the root mean square of the peak value of the amplitude in the predetermined segment, has been encoded in the encoding method similar to the encoding method corresponding to the simple tactile signal, and
in a case where the segment, in which the peak value of the amplitude that has been received exceeds the root mean square of the peak value of the amplitude in the predetermined segment, having been encoded in the simple tactile encoding method is indicated by the encoding method information that has been received, the decoding unit decodes the amplitude change encoded data.

17. The decoding device according to claim 3, further comprising
a storage unit configured to store information regarding the beginning segment of the tactile signal,
wherein the signal generation unit generates the beginning segment of the tactile signal on a basis of the information regarding the beginning segment of the tactile signal.

18. The decoding device according to claim 1, further comprising
a determination unit configured to determine an encoding method for each of the encoded data on a basis of the encoding method information that has been received,
wherein the decoding unit decodes the each of the encoded data on a basis of the encoding method corresponding to the each of the encoded data that has been determined by the determination unit.

19. A decoding method comprising
decoding, by a processor, a plurality of pieces of encoded data on a basis of encoding method information that has been received, received bitstream data including the plurality of pieces of encoded data in which a plurality of segments of a tactile signal has been respectively encoded,
wherein the encoding method information includes information indicating in which encoding method of a plurality of encoding methods the respective segments of the tactile signal have been encoded,
the plurality of encoding methods includes a simple tactile encoding method corresponding to a simple tactile signal related to a beginning segment of the tactile signal, and
the plurality of pieces of encoded data includes simple tactile encoded data in which the simple tactile signal has been encoded in the simple tactile encoding method,
the decoding method further comprising decoding the simple tactile encoded data, in a case where the encoding method information indicates the simple tactile encoding method.

20. A decoding device comprising
a non-transitory computer-readable medium,
a decoding unit configured to decode a plurality of pieces of encoded data on a basis of encoding method information that has been received, received bitstream data including the plurality of pieces of encoded data in which a plurality of segments of a tactile signal has been respectively encoded,
wherein the encoding method information includes information indicating in which encoding method of a plurality of encoding methods stored on the non-transitory computer-readable medium, the respective segments of the tactile signal have been encoded,
the plurality of encoding methods includes a simple tactile encoding method corresponding to a simple tactile signal related to a beginning segment of the tactile signal, the plurality of pieces of encoded data includes simple tactile encoded data in which the simple tactile signal has been encoded in the simple tactile encoding method, and
the decoding unit decodes the simple tactile encoded data, in a case where the encoding method information indicates the simple tactile encoding method.

* * * * *